United States Patent

Kawamura et al.

Patent Number: 6,007,964
Date of Patent: Dec. 28, 1999

[54] PLANOGRAPHIC ORIGINAL PLATE

[75] Inventors: Koichi Kawamura; Kazuo Maemoto; Hidekazu Oohashi, all of Shizuoka-ken, Japan

[73] Assignee: Fuji Photo Film Co., Ltd., Minami-Ashigara, Japan

[21] Appl. No.: 09/050,890

[22] Filed: Mar. 31, 1998

[30] Foreign Application Priority Data

Apr. 3, 1997 [JP] Japan ................................. 9-085328
Apr. 8, 1997 [JP] Japan ................................. 9-089451
Apr. 8, 1997 [JP] Japan ................................. 9-089816

[51] Int. Cl.$^6$ .............................. G03F 7/004; G03F 7/09; G03C 1/72; G03C 1/77
[52] U.S. Cl. .................................. 430/278.1; 430/270.1; 430/280.1; 430/283.1; 430/287.1; 430/944
[58] Field of Search .............................. 430/270.1, 280.1, 430/287.1, 283.1, 944, 278.1, 914, 920, 921, 924, 925

[56] References Cited

U.S. PATENT DOCUMENTS 5,204,217 4/1993 Aoai et al. ........................... 430/270.1

FOREIGN PATENT DOCUMENTS

0327998 A2 3/1989 European Pat. Off. .
0327998 8/1989 European Pat. Off. .

OTHER PUBLICATIONS

Ahn et al. "Photoacid Generating Polymers Based on Sulfonyloxymaleimides and Application as Single–Component Resists"—Journal of Polymer Science: Part A: Polymer Chemistry, vol. 34, pp. 183–191 (1996).

Shirai et al. "Polysiloxane Formation at the Irradiated Surface of Polymers Containing Both Photoacid Generating Units & Epoxy Units"—European Polymer Journal, vol. 33, No. 8, pp. 1255–1262 (1997).

Abstract of Japanese Patent Application, Publication No. 63026653 —Yoshitaka, Apr. 2, 1988.

Abstract of Japanese Patent Application, Publication No. 63257750—Tsugio, Oct. 23, 1988.

Patent Abstracts of Japan, vol. 013, No. 073, (P–830), Feb. 20, 1989 & JP 63 257750A (Oji Paper Co. Ltd.), Oct. 25, 1988 *abstract*.

Patent Abstracts of Japan, vol. 012, No. 235, (P–725), Jul. 6, 1998 & JP 63 026653A (Tosoh Corp.), Feb. 4, 1988 *abstract*.

K. Ichimura et al, "A Novel Concept of Acid Proliferation. Autocatalytic Fragmentation of an Acetoacetate Derivative as an Acid Amplifier", *Chemistry Letters 1995*, pp. 551–552.

*Primary Examiner*—Janet Baxter
*Assistant Examiner*—Sin J. Lee
*Attorney, Agent, or Firm*—Burns, Doane, Swecker & Mathis, LLP

[57] ABSTRACT

The object of the present invention is to provide a planographic original plate which can be engraved directly according to digital signals by laser beams and which can be water-developed or can be used directly for printing without a developing process. This objective has been achieved by a planographic original plate comprising a substrate and a photosensitive layer which is supported by the substrate and which contains a polymeric compound having as a side chain at least one structural unit selected from the structural units represented by the general formulas (1) to (3).

General Formula (1)

$$-SO_3-CH_2-L_n-O-Z$$

In the general formula (1), L represents a linking group composed of a non-metallic atom. —O—Z represents a group which is decomposed by an acid to become —OH. n is 0 or 1.

General Formula (2)

$$-SO_3-L-W^1$$

In the general formula (2), $W^1$ represents a group which is decomposed by an acid and selected from an ester group, a ketal group, a thioketal group, an acetal group and a tertiary alcohol group. L represents a polyvalent linking group comprising a non-metallic atom, which is necessary for linking the structural unit which is represented by the general formula (2) to a polymer skeleton, and whose decomposition accompanies the decomposition of $W^1$, which is decomposed by an acid, to generate sulfonic acid.

General Formula (3)

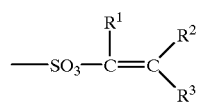

In the general formula (3), $R^1$ to $R^3$ may be the same or different, and each represents a group selected from a hydrogen atom, an alkyl group, an aryl group, a substituted amino group, an alkylthio group, an arylthio group, an alkoxy group, an aryloxy group, a carboxyl group, an alkoxycarbonyl group, an aryloxycarbonyl group, an acyl group, a cyano group, a halogen atom, and an amido group. Any two of $R^1$ to $R^3$ and a carbon atom linked thereto may form a ring together with a non-metallic atom.

7 Claims, No Drawings

PLANOGRAPHIC ORIGINAL PLATE

BACKGROUND OF THE INVENTION

1. Field of the Invention

The present invention relates to a planographic original plate. More specifically, the present invention relates to a planographic original plate which can be engraved directly by visible rays or laser beams such as infrared rays according to digital signals, and which can be water-developed, or can be mounted directly on a printing machine and used for printing without a developing process.

2. Description of the Related Art

A conventional manufacturing process of a printing plate by a PS (presensitized plate) includes a wet developing process to remove image-wise the photosensitive layer prepared on a substrate after exposure, and post-treatment processes of the developed printing plate such as rinsing with water and desensitization by means of rinsing with water containing a surfactant, or a solution containing gum arabic and a starch derivative.

In recent years, the plate making and printing industries have had to face the problem of environmental pollution due to the alkaline waste water from the developing process. At the same time, these industries have had been pursuing the rationalization of the plate making process. Accordingly, there is a demand for an original printing plate which does not require the above-mentioned complicated wet developing process by means of a developing solution and post-treatment process, and which can be used for printing directly after exposure without further processing.

As an example of an original plate which does not require a developing process after exposure, U.S. Pat. No. 5,258,263 discloses a planographic printing plate having a photosensitive hydrophilic layer whose curing or insolubilization is accelerated in the exposed region together with a photosensitive hydrophobic layer laminated on a substrate. However, because of the two-layer structure of the plate, this printing plate has a drawback that the adhesion between the upper layer and the lower layer is too weak to print a large number of printings.

On the other hand, U.S. Pat. Nos. 5,353,705 and 5,379,698 disclose a planographic original plate having a silicone layer and a laser-thermosensitive layer beneath the silicone layer, so as to provide a plate which does not require wet developing after the formation of an image. Although these plates dispense with wet developing, they have the drawback of requiring treatment by rubbing or by a special roller in order to ensure the complete removal of the silicone layer with laser abrasion, and therefore the process is complicated.

Japanese Patent Application Laid-Open (JP-A) Nos. 5-77,574, 4-125,189, U.S. Pat. No. 5,187,047, and JP-A No. 62-195,646 disclose the preparation of a planographic original plate which does not require a developing process by using as the printing material a film which is made by the sulfonation of a polyolefin, and changing the surface hydrophilicity of the film by thermal writing. The drawback associated with this technique is that, although the developing process is not necessary, the thermal writing generates a noxious gas because an image is formed by desulfonation of the surface of the planographic original plate.

U.S. Pat. Nos. 5,102,771 and 5,225,316 disclose a planographic original plate which is made up of a combination of a polymer having an acid-susceptible group in a side chain and a photo acid generating agent so as to provide a planographic original plate which dispenses with a developing process. The drawback associated with this technique is that the durability of the planographic original plate is poor and the sharpness of the printed image is inferior, because the acid generated is a carboxylic acid and the level of hydrophilicity is too low to keep the plate clean.

JP-A No. 4-121,748 disclose a photosensitive material which is made up of a combination of a polymer having a sulfonate group in a side chain and an acid generating agent together with a dye. This technique, however, involves a developing process by use of an alkaline developing solution, and therefore it does not propose any system which employs water-processing or dispenses with a developing process.

SUMMARY OF THE INVENTION

The object of the present invention is to provide a planographic original plate which can be water-developed or dispenses with special processing such as wet developing or rubbing after image writing. More specifically, the object of the present invention is to provide a planographic original plate which can be engraved directly according to digital data signals by a recording means such as a solid laser or a semiconductor laser emitting infrared rays in particular.

This objective has been achieved by a planographic original plate comprising a substrate and a photosensitive layer which is supported by the substrate and contains a polymeric compound which has as a side chain at least one structural unit selected from the group consisting of a structural unit represented by the general formula (1), a structural unit represented by the general formula (2) and a structural unit represented by the general formula (3).

General Formula (1)

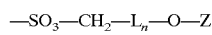

In the general formula (1), L represents a linking group composed of a non-metal atom. —O—Z represents a group which is decomposed by acid to become —OH. n is 0 or 1.

General Formula (2)

In the general formula (2), $W^1$ represents a group which is decomposed by an acid and is selected from an ester group, a ketal group, a thioketal group, an acetal group and a tertiary alcohol group. L represents a polyvalent linking group comprising a non-metallic atom, which is necessary for linking the structural unit which is represented by the general formula (2) to a polymer skeleton, and whose decomposition accompanies the decomposition of $W^1$, which is decomposed by an acid, to generate sulfonic acid.

General Formula (3)

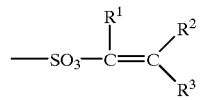

In the general formula (3), $R^1$ to $R^3$ may be the same or different, and each represents a group selected from a hydrogen atom, an alkyl group, an aryl group, a substituted amino group, an alkylthio group, an arylthio group, an alkoxy group, an aryloxy group, a carboxyl group, an alkoxycarbonyl group, an aryloxycarbonyl group, an acyl group, a cyano group, a halogen atom and an amido group. Any two of $R^1$ to $R^3$ and a carbon atom linked thereto may form a ring together with a non-metal atom.

In the planographic original plate of the present invention, if an acid is generated image-wise in the photosensitive layer, at least one structural unit selected from the group consisting of a structural unit represented by the general formula (1), a structural unit represented by the general formula (2) and a structural unit represented by the general formula (3) decomposes so that —SO₃— which is hydrophilic is released. As a result, the recording of an image, i.e., the plate making of a recording material is performed. For example, if the photosensitive layer contains a compound which generates an acid by the action of light or heat, the acid is generated by decomposing the compound by means of an energy provided by a solid laser, a semiconductor laser, or the like which emits infrared rays. If the photosensitive layer contains no compound capable of generating an acid, an acid is supplied image-wise from outside by, for example, an ink-jet device.

DETAILED DESCRIPTION OF THE PREFERRED EMBODIMENTS

Details of the present invention are given below.

The planographic original plate of the present invention comprises a substrate having a photosensitive layer thereon which contains a polymeric compound having a specific side chain which is described later. Further, the planographic original plate comprises a subbing layer, a back coat layer, and other layers, if necessary.

In addition to the polymeric compound, the photosensitive layer contains other components which are selected appropriately according to purpose and which are exemplified by an acid generating agent, an infrared ray absorber, and the like.

(Polymeric compound having a specific side chain)

This polymeric compound has as a side chain at least one structural unit selected from the group consisting of a structural unit represented by the general formula (1), a structural unit represented by the general formula (2) and a structural unit represented by the general formula (3). Polymeric compounds having as a side chain a structural unit represented by the general formula (1)

General Formula (1)

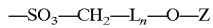

$-SO_3-CH_2-L_n-O-Z$

In the general formula (1), L represents a linking group composed of a non-metallic atom. —O—Z represents a group which is decomposed by acid to become —OH. n is 0 or 1.

Z is a group which is decomposed by the action of an acid, and a preferred example of Z is an atomic group generally used as a protective group for a hydroxyl group. Examples of these atomic groups are described in T. W. Greene, "Protective Groups in Organic Synthesis", John Wiley & Sons, Inc. (1991). Among these atomic groups, those represented by the following general formulas (4) to (9) are particularly preferable.

General Formula (4)

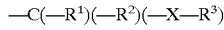

$-C(-R^1)(-R^2)(-X-R^3)$

In the general formula (4), $R^1$ represents a group selected from a hydrogen atom, a substituted or unsubstituted alkyl group having 1 to 20 carbon atoms such as methyl and ethyl, a group such as a tetrahydrofuranyl group capable of forming a ring together with —X—$R^3$, and a group such as a 1-methoxycyclohexyl group capable of forming a ring together with —$R^2$. $R^2$ is the same as $R^1$ or alternatively represents a substituted or unsubstituted alkoxy group having 1 to 20 carbon atoms such as methoxy, ethoxy and 2-chloroethoxy. X represents an oxygen atom or a sulfur atom. $R^3$ represents a group selected from a substituted or unsubstituted alkyl group having 1 to 20 carbon atoms such as methyl, ethyl, 2-chloroethyl, benzyl and 4-methoxybenzyl, a substituted or unsubstituted aryl group having 6 to 20 carbon atoms such as phenyl and 4-methoxyphenyl, and a silyl group such as trimethylsilyl and t-butyldimethylsilyl.

Specific examples of the group which is made up of atoms and represented by the general formula (4) include substituted methyl ethers such as methoxymethyl, methoxythiomethyl, benzyloxymethyl, p-methoxybenzyloxymethyl, (4-methoxyphenoxy)methyl, guaiacolmethyl, t-butoxymethyl, 4-pentenoylmethyl, t-butyl-dimethylsilyloxymethyl, 2-ethoxymethoxymethyl, 2,2,2-trichloroethoxymethyl, bis(2-chloroethoxy)methyl, 2-(trimethylsilyl)ethoxymethyl, tetrahydropyranyl, 3-bromotetrahydropyranyl, tetrahydrothiopyranyl, 1-methoxycyclohexyl, 4-methoxytetrahydropyranyl, 4-methoxytetrahydrothiopyranyl, S,S-dioxide-4-methoxytetrahydrothiopyranyl, 1-[(2-chloro-4-methyl)phenyl]-4-methoxypiperidine-4-yl, 1,4-dioxane-2-yl, tetrahydrofuranyl, tetrahydrothiofuranyl and 2,3,3a,4,5,6,7,7a-octahydro-7,8,8-trimethyl-4,7-methanobenzofuran-2-yl.

General Formula (5)

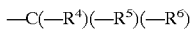

$-C(-R^4)(-R^5)(-R^6)$

In the general formula (5), $R^4$, $R^5$ and $R^6$ each represents a substituted or unsubstituted alkyl group having 1 to 20 carbon atoms such as methyl, ethyl, 2-chloroethyl and 2-phenethyl.

Specific examples of the atomic group represented by the general formula (5) include a t-butyl group and a t-octyl group.

General Formula (6)

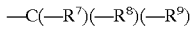

$-C(-R^7)(-R^8)(-R^9)$

In the general formula (6), $R^7$ and $R^8$ each represent a group selected from a hydrogen atom, a substituted or unsubstituted alkyl group having 1 to 20 carbon atoms such as methyl and ethyl, and a substituted or unsubstituted aryl group having 6 to 20 carbon atoms such as phenyl and 4-methoxyphenyl. $R^9$ represents a substituted or unsubstituted aryl group having 6 to 20 carbon atoms such as phenyl and 4-methoxyphenyl.

Specific examples of the atomic group represented by the general formula (6) include 4-methoxybenzyl, 3,4-dimethoxybenzyl, 2-picolyl, diphenylmethyl, 5-dibenzosuberyl, triphenylmethyl, α(-naphthyldiphenylmethyl, p-methoxyphenyldiphenylmethyl, 4,4', 4"-tris(benzoyloxyphenyl)methyl, 3-(imidazole-1-yl-methyl)bis(4',4"-dimethoxyphenyl)methyl, 9-anthryl, 9-(9-phenyl)xanthenyl and 9-(9-phenyl-10-oxo)anthryl.

General Formula (7)

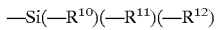

$-Si(-R^{10})(-R^{11})(-R^{12})$

In the general formula (7), $R^{10}$, $R^{11}$ and $R^{12}$ each represents a group selected from a substituted or unsubstituted alkyl group having 1 to 20 carbon atoms such as methyl and ethyl, and a substituted or unsubstituted aryl group having 6 to 20 carbon atoms such as phenyl, 4-bromophenyl and 4-methoxyphenyl.

Specific examples of the atomic group represented by the general formula (7) include trimethylsilyl, triethylsilyl, t-butyldimethylsilyl, t-butyldiphenylsilyl, tribenzylsilyl, triphenylsilyl, diphenylmethylsilyl, and t-butylmethoxyphenylsilyl.

General Formula (8)

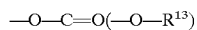

In the general formula (8), $R^{13}$ represents a group selected from a substituted or unsubstituted alkyl group having 1 to 20 carbon atoms such as methyl, ethyl, t-butyl, benzyl and 4-methoxybenzyl and a substituted or unsubstituted allyl group having 2 to 20 carbon atoms such as vinyl.

Specific examples of the atomic group represented by the general formula (8) include methyl carbonate, ethyl carbonate, t-butyl carbonate, 2,2,2-trichloroethyl carbonate, vinyl carbonate, and benzyl carbonate.

General Formula (9)

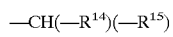

In the general formula (9), $R^{14}$ and $R^{15}$ each represents a group selected from a substituted or unsubstituted alkyl group having 1 to 20 carbon atoms such as methyl, ethyl, benzyl and 4-methoxybenzyl and a cyclic alkyl group such as cyclohexyl, with the proviso that one of $R^{14}$ and $R^{15}$ is substituted by a carbonyl group.

Specific examples of the atomic group represented by the general formula (9) include 3-oxocyclohexyl.

In the general formula (1), the linking group which is represented by L and comprises a non-metallic atom is composed of 1 to 60 carbon atoms, 0 to 10 nitrogen atoms, 0 to 50 oxygen atoms, 1 to 100 hydrogen atoms, and 0 to 20 sulfur atoms. More specifically, the linking group L comprises a combination of the structural units given below, with the proviso that the —O—Z group of the structural units represented by the general formula (1) denotes a hydroxyl group protected by a group which is decomposed by an acid and, therefore, a carbonyl or sulfonyl group is not directly linked to the —O—Z group.

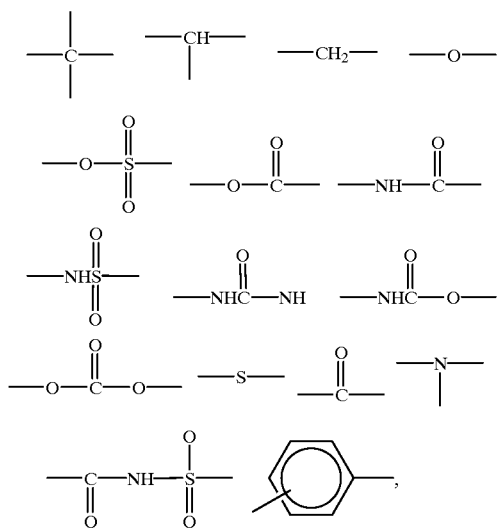

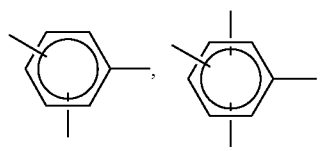

polyvalent naphthalene, polyvalent anthracene

The linking group comprising a non-metallic atom represented by L may bear a substituent. Examples of the substituent include a group selected from an alkyl group having 1 to 20 carbon atoms such as methyl and ethyl, an aryl group having 6 to 16 carbon atoms such as phenyl and naphthyl, a hydroxyl group, a carboxyl group, a sulfonamido group, an N-sulfonylamido group, an acyloxy group having 1 to 6 carbon atoms such as acetoxy, an alkoxy group having 1 to 6 carbon atoms such as methoxy and ethoxy, a halogen atom such as chlorine and bromine, an alkoxycarbonyl group having 2 to 7 carbon atoms such as methoxycarbonyl, ethoxycarbonyl and cyclohexyloxycarbonyl, a cyano group, and a carbonate group such as t-butyl carbonate.

More specifically, the examples of the polymeric compound having as a side chain a structural unit represented by the general formula (1) include polymeric compounds which are obtained by a radical polymerization of any of the monomers (1) to (16) given below.

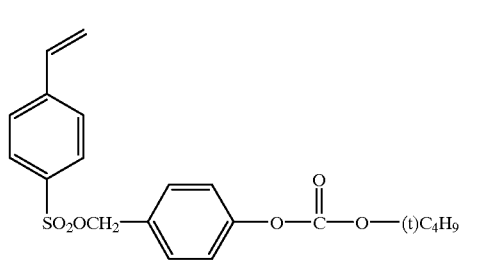

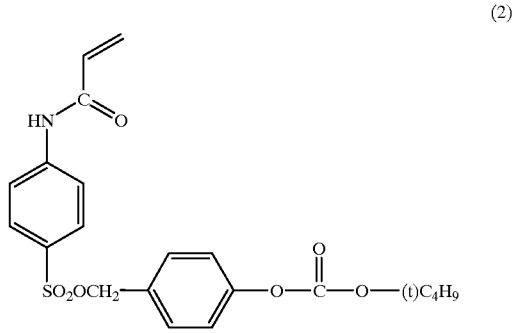

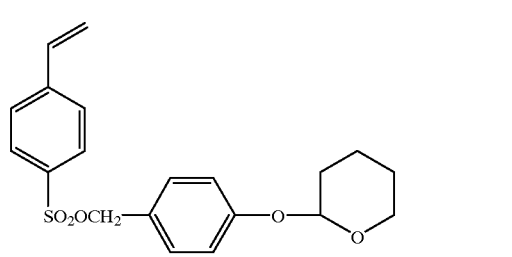

(4)
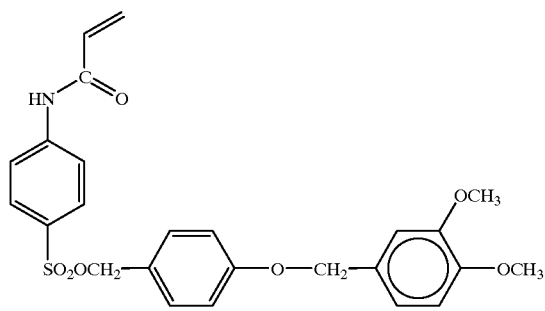
(5)
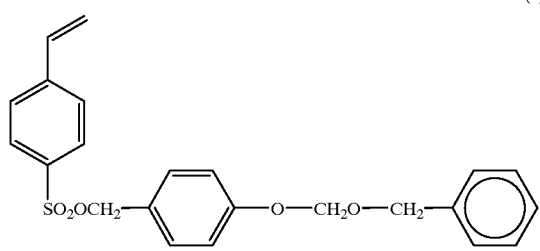
(6)
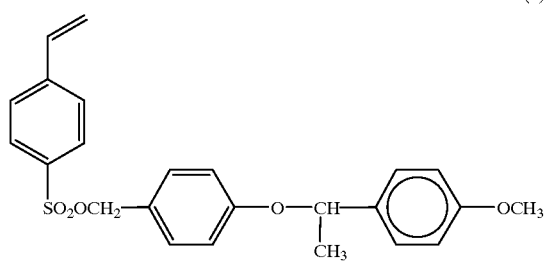
(7)
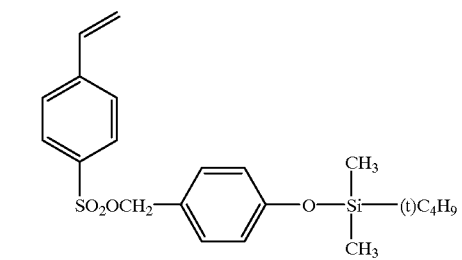
(8)
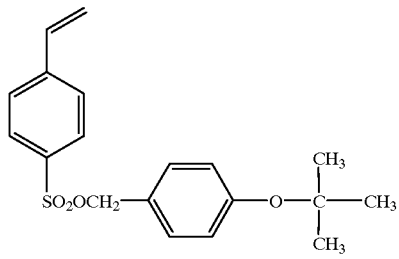
(9)
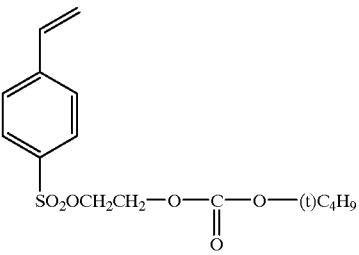
(10)
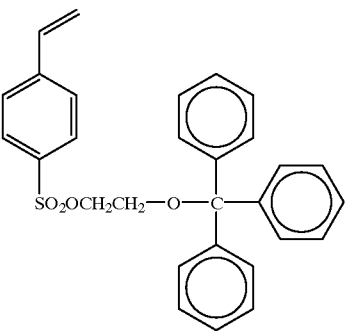
(11)
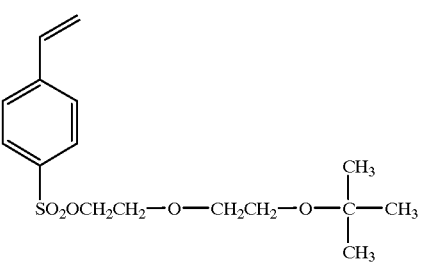
(12)
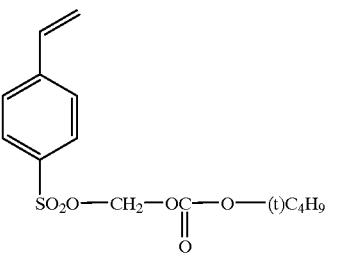
(13)
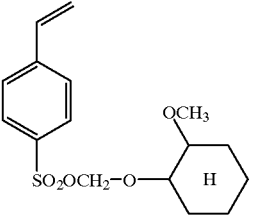

-continued

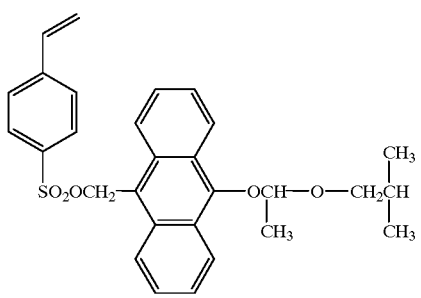

(14)

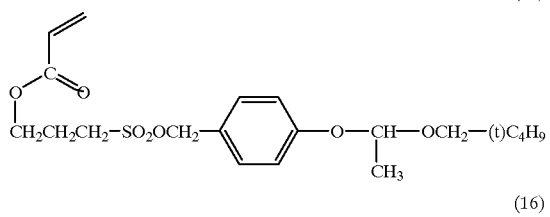

(15)

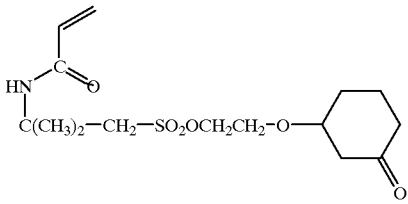

(16)

The present invention employs a polymeric compound (hereinafter sometimes referred to as "polymer") which is obtained by a radical polymerization of a monomer having as a side chain the structural unit represented by the general formula (1). However, the polymer may be a copolymer made up of the monomer having as a side chain the structural unit represented by the general formula (1) and another type of monomer.

A desirable polymeric compound for use in the present invention is a copolymer obtained by a radical polymerization of a monomer having as a side chain the structural unit represented by the general formula (1) and other known monomers.

Examples of the other monomers include known monomers such as acrylates, methacrylates, acrylamides, methacrylamides, vinyl esters, styrenes, acrylic acid, methacrylic acid, acrylonitrile, maleic anhydride and maleimides.

Specific examples of the acrylate include methyl acrylate, ethyl acrylate, (n- or i-) propyl acrylate, (n-, i-, sec- or t-)butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenylcarbonyloxy)ethyl acrylate.

Specific examples of the methacrylate include methyl methacrylate, ethyl methacrylate, (n- or i-) propyl methacrylate, (n-, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, and 2-(hydroxyphenylcarbonyloxy)ethyl methacrylate.

Specific examples of the acrylamide include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(hydroxyphenyl)acrylamide, N-(sulfamoylphenyl)acrylamide, N-(phenylsufonyl)acrylamide, N-(tolylsulfonyl)acrylamide, N,N-dimethylacrylamide, N-methyl-N-phenylacrylamide, and N-hydroxyethyl-N-methylacrylamide.

Specific examples of the methacrylamide include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(hydroxyphenyl)methacrylamide, N-(sulfamoylphenyl)methacrylamide, N-(phenylsufonyl)methacrylamide, N-(tolylsulfonyl)methacrylamide, N,N-dimethylmethacrylamide, N-methyl-N-phenylmethacrylamide, and N-hydroxyethyl-N-methylmethacrylamide.

Specific examples of the vinyl esters include vinyl acetate, vinyl butylate, and vinyl benzoate.

Specific examples of the styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, and carboxystyrene.

Among these other monomers, particularly preferable monomers are acrylates, methacrylates, acrylamides, methacrylamides, vinyl esters, and styrenes, each having 20 or less carbon atoms, as well as acrylic acid, methacrylic acid, and acrylonitrile.

In addition to these other monomers, a copolymerization with a monomer having cross-linkable reactivity is also possible.

Preferred examples of the monomer having cross-linkable reactivity include glycidyl methacrylate, N-methylolmethacrylamide, ω-(trimethoxysilyl)propyl methacrylate, and 2-isocyanateethyl acrylate.

The content of the structural unit represented by the general formula (1) in a copolymer prepared by using any of these monomers is preferably 5% by weight or more and more preferably 10% by weight or more. If the content is less than 5%, an image may not be formed, whereas, if the content is more than 10% by weight, residual film may remain after the image formation.

In the present invention, the weight average molecular weight of the polymeric compound, which has as a side chain at least one of the structural units represented by the general formula (1), is preferably 2,000 or more and more preferably in the range of from 5,000 to 300,000. The number average molecular weight is preferably 800 or more and more preferably in the range of from 1,000 to 250,000. The index of polydispersity (weight average molecular weight/number average molecular weight) is preferably in the range of from 1.1 to 10.

These polymeric compounds may be a random polymer, a block polymer, or a graft polymer. However, a random polymer is preferable.

Examples of the solvent which is used for the synthesis of the polymeric compound include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, and water. These solvents may be used singly or in combinations of two or more.

An initiator for the radical polymerization to synthesize the polymeric compound may be a known initiator such as an azo initiator or a peroxide initiator.

The polymeric compounds may be used singly or in combinations of two or more. The amount added of the polymeric compound in the photosensitive composition of the present invention is in the range of from 50 to 98% by weight, more preferably in the range of from 60 to 97% by weight, based on the weight of the total solids of the composition constituting the photosensitive layer of the planographic original plate. If the amount added is less than 50% by weight, the printed image is blurred, whereas, if the amount added is more than 98% by weight, the image is not sufficiently formed. The amount in the range of from 60 to 97% by weight leads to a desired sharp image.

Specific examples of the polymeric compounds (1) to (12) (polymerization units or copolymerization units) are given below. In these examples, the numerals after the brackets denoting copolymerization units are the weight ratios of the copolymers.

(1)

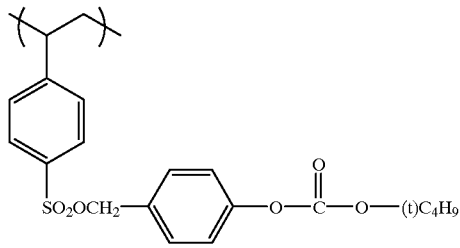

(2)

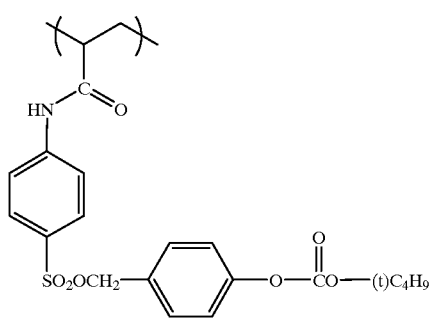

(3)

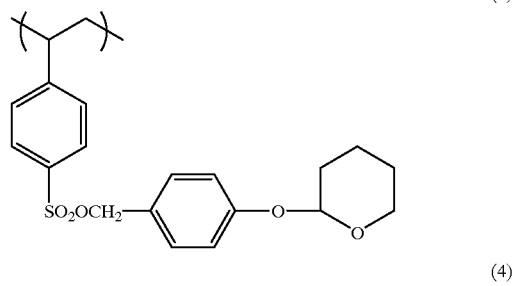

(4)

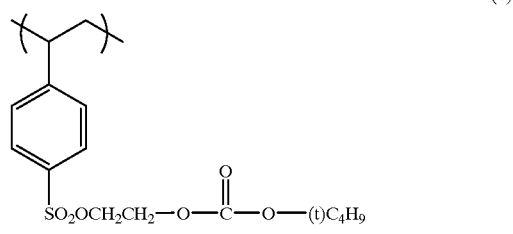

(5)

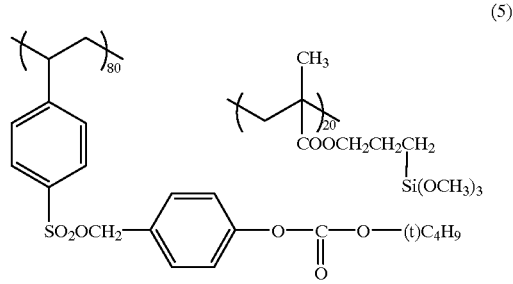

(6)

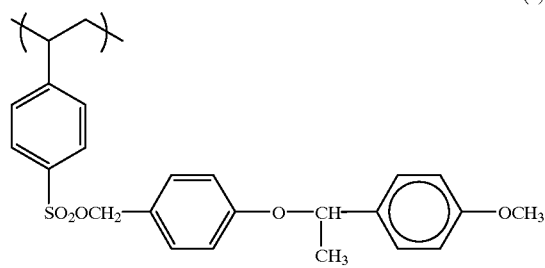

(7)

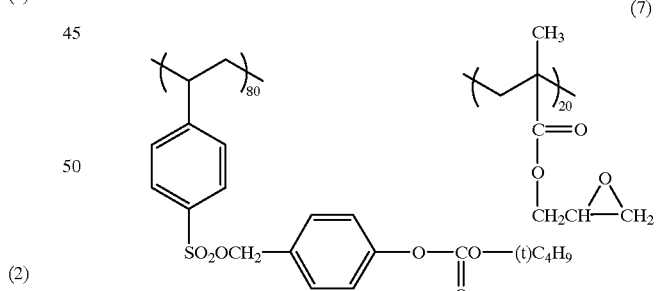

(8)

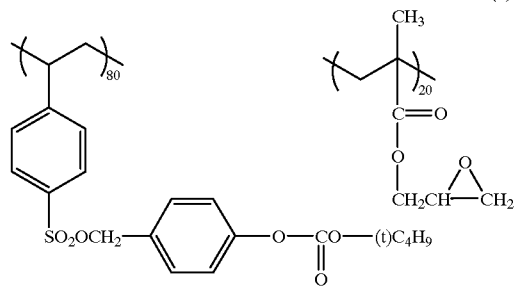

-continued (9)

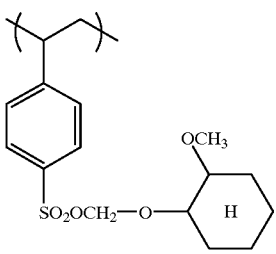

(10)

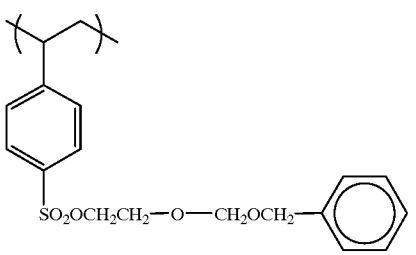

(11)

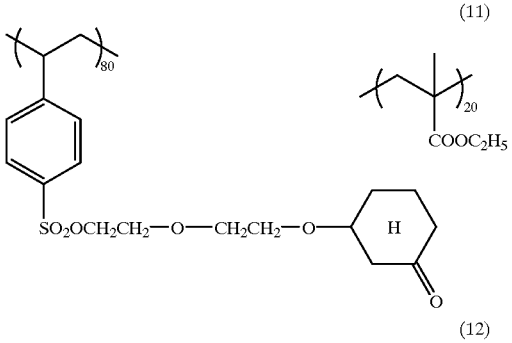

(12)

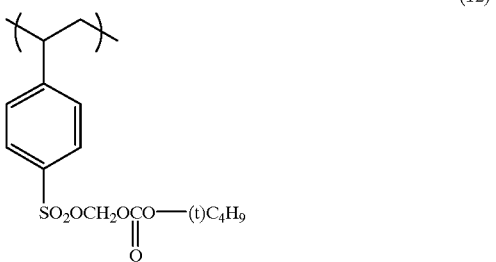

Polymeric compounds having as a side chain a structural unit represented by the general formula (2)

General Formula (2)

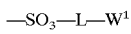

In the general formula (2), $W^1$ represents a group which is decomposed by an acid and is selected from an ester group, a ketal group, a thioketal group, an acetal group, and a tertiary alcohol group. L represents a polyvalent linking group comprising a non-metallic atom, which is necessary for linking the structural unit which is represented by the general formula (2) to a polymer skeleton, and whose decomposition accompanies the decomposition of $W^1$, which is decomposed by an acid, to generate sulfonic acid. More specifically, the linking group L comprises a combination of the structural units represented by the formula (2).

Preferred examples of the polymeric compound having as a side chain a structural unit represented by the general formula (2), are the polymeric compounds having as a side chain any of the structural units represented by the following general formulas (a) to (d).

General Formula (a)

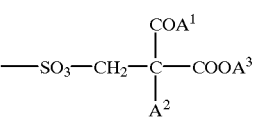

In the general formula (a), $A^1$ represents an alkyl group or an aryl group. $A^2$ represents a hydrogen atom, an alkyl group or an aryl group. $A^3$ represents a protective group for the carboxyl group which decomposes by the action of an acid.

More specifically, $A^1$ represents an alkyl group having 1 to 20 carbon atoms such as methyl and ethyl, or an aryl group having 6 to 20 carbon atoms such as phenyl and 4-methoxyphenyl. $A^2$ represents a hydrogen atom, an alkyl group having 1 to 20 carbon atoms such as methyl and ethyl or an aryl group having 6 to 20 carbon atoms such as phenyl and 4-methoxyphenyl.

$A^1$ and $A^2$ may both be substituted by a substituent. Examples of the substituent include an alkyl group, an aryl group, a halogen atom, a cyano group, an amino group, an alkoxy group, a phenoxy group, a carboxyl group, an alkoxycarbonyl group, and acyl group, and an amido group.

$A^3$ is a group which is decomposed by the action of an acid, and, generally, an atomic group used as a protective group for a carboxyl group is effectively used. Examples of these atomic groups are described in T. W. Greene, "Protective Groups in Organic Synthesis", John Wiley & Sons, Inc. (1991). These groups protect a carboxyl group, but the protective action is broken by the action of an acid. Among these atomic groups, those represented by the following general formulas (1A) to (1D) are particularly preferable as specific examples of $A^3$.

General Formula (1A)

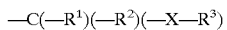

In the general formula (1A), $R^1$ represents a group selected from the group consisting of a hydrogen atom, an alkyl group having 1 to 20 carbon atoms such as methyl and ethyl, a group such as a tetrahydrofuranyl group capable of forming a ring together with —X—$R^3$ and a group such as a 1-methoxy cyclohexyl group capable of forming a ring together with $R^2$. $R^2$ is the same as $R^1$ or, alternatively, $R^2$ represents an alkoxy group having 1 to 20 carbon atoms such as a methoxy, ethoxy, and 2-chloroethoxy. X represents an oxygen atom or a sulfur atom. $R^3$ represents a group selected from the group consisting of an alkyl group having 1 to 20 carbon atoms such as methyl, ethyl, 2-chloroethyl, benzyl, 4-methoxybenzyl, 2-(trimethylsilyl)ethyl, and 2-(t-butyldimethylsilyl)ethyl, and an aryl group having 6 to 20 carbon atoms such as phenyl and 4-methoxyphenyl.

$R^1$ to $R^3$ may be substituted by a substituent selected from the group consisting of an alkyl group, an aryl group, a halogen atom, a cyano group, an amino group, an alkoxy group, a phenoxy group, a carboxyl group, an alkoxycarbonyl group, an acyl group, and an amido group.

Specific examples of the atomic group represented by the general formula (1A) include substituted methyl ethers such as methoxymethyl, methoxythiomethyl, benzyloxymethyl, p-methoxybenzyloxymethyl, (4-methoxyphenoxy)methyl, guaiacolmethyl, t-butoxymethyl, 4-pentenoylmethyl, t-butyl-dimethylsilyloxymethyl, 2-ethoxymethoxymethyl, 2,2,2-trichloroethoxymethyl, bis(2-chloroethoxy)methyl, 2-(trimethylsilyl)ethoxymethyl, tetrahydropyranyl, 3-bromotetrahydropyranyl, tetrahydrothiopyranyl, 1-methoxycyclohexyl, 4-methoxytetrahydropyranyl, 4-methoxytetrahydrothiopyranyl, S,S-dioxide-4-methoxytetrahydrothiopyranyl, 1-[(2-chloro-4-methyl)phenyl]-4-methoxypiperidine-4-yl, 1,4-dioxane-2-yl, tetrahydrofuranyl, tetrahydrothiofuranyl, and 2,3,3a,4,5,6,7,7a-octahydro-7,8,8-trimethyl-4,7-methanobenzofuran-2-yl.

General Formula (1B)

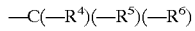

In the general formula (1B), $R^4$, $R^5$ and $R^6$ each represents an alkyl group having 1 to 20 carbon atoms such as methyl, ethyl, 2-chloroethyl, and 2-phenethyl. The alkyl group may be substituted by a substituent selected from an aryl group, a halogen atom, an cyano group, an amino group, an alkoxy group, a phenoxy group, a carboxyl group, an alkoxycarbonyl group, an acyl group, and an amido group.

Specific examples of the atomic group represented by the general formula (1B) include a t-butyl group and a t-octyl group.

General Formula (1C)

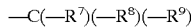

In the general formula (1C), $R^7$ and $R^8$ each represent a group selected from a hydrogen atom, an alkyl group having 1 to 20 carbon atoms such as methyl and ethyl, and an aryl group having 6 to 20 carbon atoms such as phenyl and 4-methoxyphenyl. $R^9$ represents an aryl group having 6 to 20 carbon atoms such as phenyl and 4-methoxyphenyl. $R^7$ to $R^9$ may be substituted by a substituent selected from an alkyl group, an aryl group, a halogen atom, an cyano group, an amino group, an alkoxy group, a phenoxy group, a carboxyl group, an alkoxycarbonyl group, an acyl group, and an amido group.

Specific examples of the atomic group represented by the general formula (1C) include 4-methoxybenzyl, 3,4-dimethoxybenzyl, 2-picolyl, diphenylmethyl, 5-dibenzosuberyl, triphenylmethyl, α-naphthyldiphenylmethyl, p-methoxyphenyldiphenylmethyl, 4,4', 4"-tris(benzoyloxyphenyl)methyl, 3-(imidazole-1-yl-methyl)bis(4',4"-dimethoxyphenyl)methyl, 9-anthryl, 9-(9-phenyl)xanthenyl, 9-(9-phenyl-10-oxo)anthryl, and α-methylcinnamyl.

General Formula (1D)

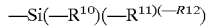

In the general formula (1D) $R^{10}$, $R^{11}$ and $R^{12}$ each represent a group selected from an alkyl group having 1 to 20 carbon atoms such as methyl and ethyl and an aryl group having 6 to 20 carbon atoms such as phenyl, 4-bromophenyl and 4-methoxyphenyl. $R^{10}$ to $R^{12}$ may be substituted by a substituent selected from the group consisting of an alkyl group, an aryl group, a halogen atom, an cyano group, an amino group, an alkoxy group, a phenoxy group, a carboxyl group, an alkoxycarbonyl group, an acyl group, and an amido group.

Specific examples of the atomic group represented by the general formula (1D) include trimethylsilyl, triethylsilyl, t-butyldimethylsilyl, t-butyldiphenylsilyl, tribenzylsilyl, triphenylsilyl, diphenylmethylsilyl, and t-butylmethoxyphenylsilyl.

General Formula (b)

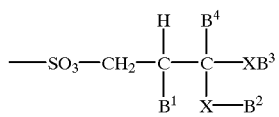

In the general formula (b), $B^1$ and $B^4$ each represent a hydrogen atom, an alkyl group, or an aryl group. X represents an oxygen atom or a sulfur atom. $B^2$ and $B^3$ each represent an alkyl group or an aryl group.

Examples of the alkyl group and the aryl group represented by $B^1$ to $B^4$ include an alkyl group having 1 to 20 carbon atoms such as methyl and ethyl and an aryl group having 6 to 20 carbon atoms such as phenyl and 4-methoxyphenyl. $B^2$ and $B^3$ may join each other to form a ring. $B^1$ to $B^4$ may be substituted by a substituent selected from an alkyl group, an aryl group, a halogen atom, an cyano group, an amino group, an alkoxy group, a phenoxy group, a carboxyl group, an alkoxycarbonyl group, an acyl group, and an amido group.

Specific examples of the structure including —C(—$XB^2$)(—$XB^3$) include aketal and an acetal such as dimethyl acetal, dimethyl ketal, bis(2,2,2-trichloroethyl) ketal, dibenzyl acetal, dibenzylketal, 1,3-dioxolane, 4-phenyl-1,3-dioxolane, 4-bromo-1,3-dioxolane, 1,3-dioxane, 4-phenyl-1,3-dioxane, 4-bromo-1,3-dioxane, and 1,3-oxathiolane.

General Formula (c)

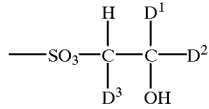

In the general formula (c), $D^1$ and $D^2$ each represent a hydrogen atom, an alkyl group, or an aryl group. $D^3$ represents an alkyl group or an aryl group.

Examples of the alkyl group and the aryl group represented by $D^1$ to $D^3$ include an alkyl group having 1 to 20 carbon atoms such as methyl and ethyl and an aryl group having 6 to 20 carbon atoms such as phenyl and 4-methoxyphenyl. $D^1$ and $D^2$ may join each other to form a ring. The alkyl groups and aryl groups represented by $D^1$ to $D^3$ may be substituted by a substituent selected from an alkyl group, an aryl group, a halogen atom, an cyano group, an amino group, an alkoxy group, aphenoxy group, a carboxyl group, an alkoxycarbonyl group, an acyl group, and an amido group.

General Formula (d)

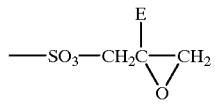

In the general formula (d), E represents a hydrogen atom, an alkyl group, or an aryl group.

Examples of the alkyl group and the aryl group represented by E include an alkyl group having 1 to 20 carbon atoms such as methyl and ethyl and an aryl group having 6 to 20 carbon atoms such as phenyl and 4-methoxyphenyl. The alkyl group and aryl group represented by E may be substituted by a substituent selected from an alkyl group, an aryl group, a halogen atom, an cyano group, an amino group, an alkoxy group, aphenoxy group, a carboxyl group, an alkoxycarbonyl group, an acyl group, and an amido group.

More specifically, examples of the polymeric compound having as a side chain the structural unit (functional group) represented by any of the general formulas (a) to (d) include polymeric compounds which are obtained by a radical polymerization of any of the monomers given below.

Specific examples of the monomer are the following compounds (1) to (16), but the present invention is not limited to these compounds.

(1)
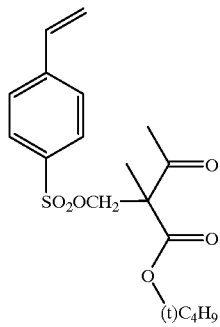

(2)
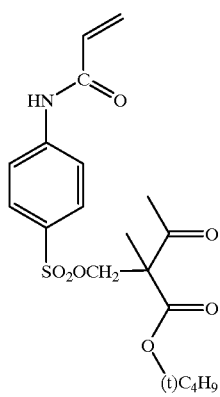

(3)
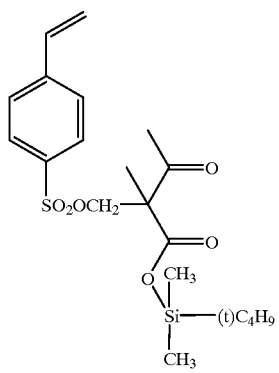

(4)
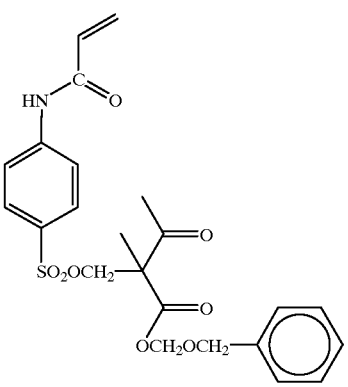

(5)
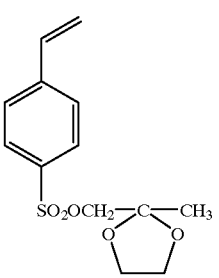

(6)
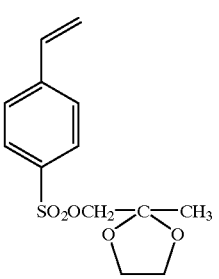

(7)
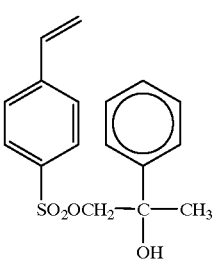

(8)
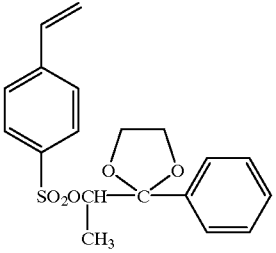

(9) 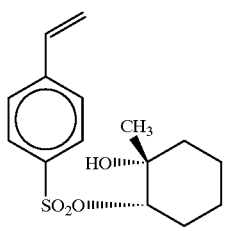

(10) 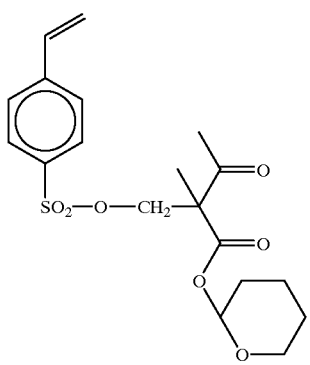

(11) 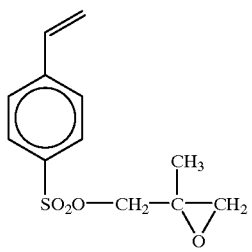

(12) 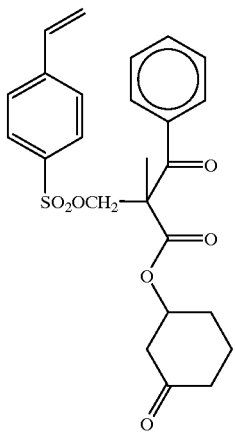

(13) 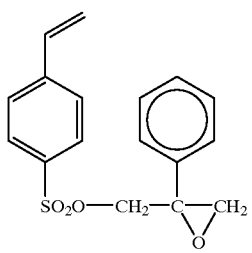

(14) 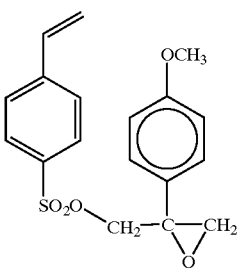

(15) 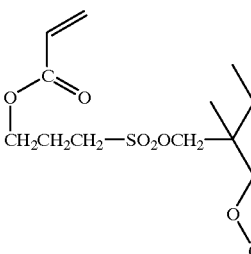

(16) 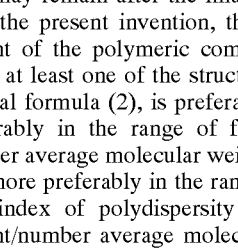

The present invention employs a polymeric compound (hereinafter sometimes referred to as "polymer") which is obtained by a radical polymerization of a monomer having as a side chain the structural unit represented by the general formula (2). However, the polymer may be a copolymer made up of the monomer having as a side chain the structural unit represented by the general formula (2) and another type of monomer.

A desirable polymeric compound for use in the present invention is a copolymer obtained by the previously described radical polymerization of a monomer having as a side chain the structural unit represented by the general formula (2) and another previously described known monomer.

The content of the structural unit represented by the general formula (2) in the copolymer is preferably 5% by weight or more and more preferably 10% by weight or more. If the content is less than 5%, an image may not be formed, whereas, if the content is more than 10% by weight, residual film may remain after the image formation.

In the present invention, the weight average molecular weight of the polymeric compound, which has as a side chain at least one of the structural units represented by the general formula (2), is preferably 2,000 or more and more preferably in the range of from 5,000 to 300,000. The number average molecular weight is preferably 800 or more and more preferably in the range of from 1,000 to 250,000. The index of polydispersity (weight average molecular weight/number average molecular weight) is preferably in the range of from 1.1 to 10.

The polymeric compounds may be used singly or in combinations of two or more. The amount added of the polymeric compound in the photosensitive composition of the present invention is in the range of from 50 to 98% by weight, more preferably in the range of from 60 to 97% by weight, based on the weight of the total solids of the composition constituting the photosensitive layer of the planographic original plate. If the amount added is less than 50% by weight, the printed image is blurred, whereas, if the amount added is more than 98% by weight, a satisfactory image is not formed. An amount in the range of from 60 to 97% by weight leads to the desired sharp image.

Examples of the polymeric compounds (1) to (12) (polymerization units or copolymerization units) are given below.

(1)
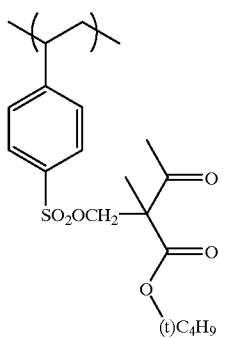

(2)
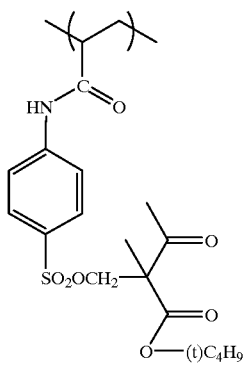

(3)
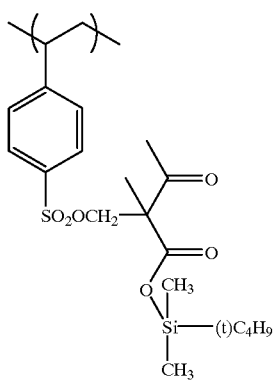

-continued (4)
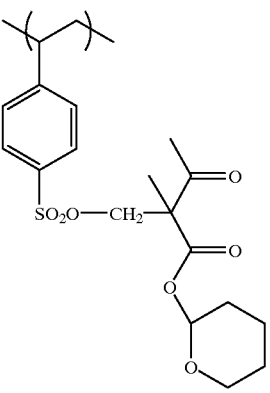

(5)
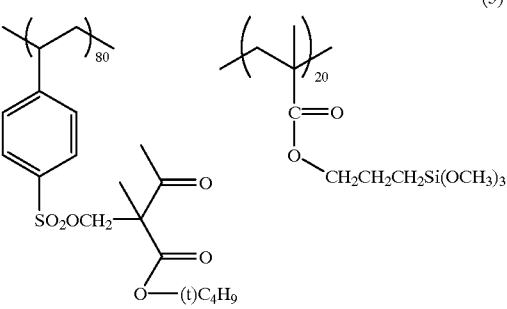

(6)
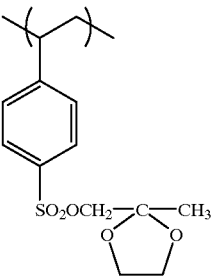

(7)
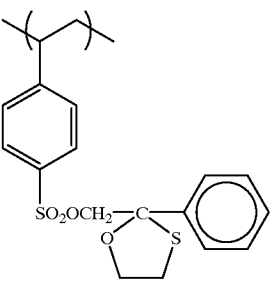

(8)
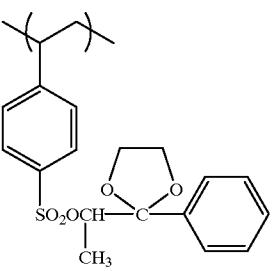

-continued

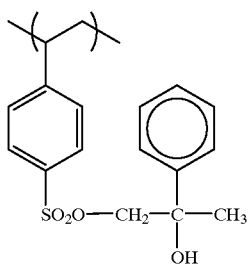
(9)

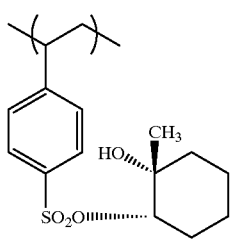
(10)

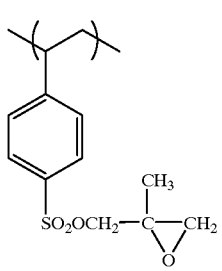
(11)

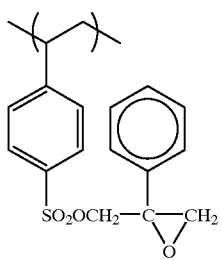
(12)

Polymeric compounds having as a side chain a structural unit represented by the general formula (3)
General Formula (3)

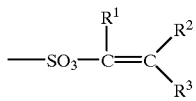

In the general formula (3), $R^1$ to $R^3$ may be the same or different and each represents a group selected from a hydrogen atom, an alkyl group, an aryl group, a substituted amino group, an alkylthio group, an arylthio group, an alkoxy group, an aryloxy group, a carboxyl group, an alkoxycarbonyl group, an aryloxycarbonyl group, an acyl group, a cyano group, a halogen atom, and an amido group. Any two of $R^1$ to $R^3$ and a carbon atom linked thereto may form a ring together with a non-metallic atom.

In the general formula (3), if $R^1$ to $R^3$ each represent an alkyl group, examples of the alkyl group include a substituted or unsubstituted alkyl group having 1 to 20 carbon atoms such as methyl and ethyl. Examples of the substituent in the substituted alkyl group include an aryl group, a halogen atom, a cyano group, an amino group, an alkoxy group, a phenoxy group, a carboxyl group, an alkoxycarbonyl group, anacyl group, and an amido group.

In the general formula (3), if $R^1$ to $R^3$ each represent an aryl group, examples of the aryl group include a substituted or unsubstituted aryl group having 6 to 20 carbon atoms such as phenyl and 4-methoxyphenyl. Examples of the substituent in the substituted aryl group include an alkyl group, a halogen atom, a cyano group, an amino group, an alkoxy group, a phenoxy group, a carboxyl group, an alkoxycarbonyl group, anacyl group, and an amido group.

In the general formula (3), if $R^1$ to $R^3$ each represent a substituted amino group, examples of the substituent in the amino group include a substituted or unsubstituted alkyl group having 1 to 20 carbon atoms such as methyl and ethyl and a substituted or unsubstituted aryl group having 6 to 20 carbon atoms such as phenyl and 4-methoxyphenyl. Examples of the substituent in the substituted alkyl group and the substituted aryl group include ahalogen atom, a cyano group, an amino group, an alkoxy group, a phenoxy group, a carboxyl group, an alkoxycarbonyl group, an acyl group, and an amido group.

In the general formula (3), if $R^1$ to $R^3$ each represent an alkylthio group or an arylthio group, examples of the alkyl group include a substituted or unsubstituted alkyl group having 1 to 20 carbon atoms such as methyl and ethyl, while examples of the aryl group include a substituted or unsubstituted aryl group having 6 to 20 carbon atoms such as phenyl and 4-methoxyphenyl. Examples of the substituent in the substituted alkyl group and the substituted aryl group include a halogen atom, a cyano group, an amino group, an alkoxy group, a phenoxy group, a carboxyl group, an alkoxycarbonyl group, an acyl group, and an amido group.

In the general formula (3), if $R^1$ to $R^3$ each represent an alkoxy group, examples of the alkyl group in the alkoxy group include a substituted or unsubstituted alkyl group having 1 to 20 carbon atoms such as methyl and ethyl. Examples of the substituent in the substituted alkyl group include an aryl group, a halogen atom, a cyano group, an amino group, an alkoxy group, a phenoxy group, a carboxyl group, an alkoxycarbonyl group, an acyl group, and an amido group.

In the general formula (3), if $R^1$ to $R^3$ each represent an aryloxy group, examples of the aryl group in the aryloxy group are a substituted or unsubstituted aryl group having 6 to 20 carbon atoms such as phenyl and 4-methoxyphenyl. Examples of the substituent in the substituted aryl group include an alkyl group, a halogen atom, a cyano group, an amino group, an alkoxy group, a phenoxy group, a carboxyl group, an alkoxycarbonyl group, an acyl group, and an amido group.

In the general formula (3), if $R^1$ to $R^3$ each represent an alkoxycarbonyl group, examples of the alkyl group in the alkoxycarbonyl group include a substituted or unsubstituted alkyl group having 1 to 20 carbon atoms such as methyl and ethyl. Examples of the substituent in the substituted alkyl group include an aryl group, a halogen atom, a cyano group, an amino group, an alkoxy group, a phenoxy group, a carboxyl group, an alkoxycarbonyl group, an acyl group, and an amido group.

In the general formula (3), if $R^1$ to $R^3$ each represent an aryloxycarbonyl group, examples of the aryl group in the aryloxycarbonyl group include a substituted or unsubstituted aryl group having 6 to 20 carbon atoms such as phenyl and 4-methoxyphenyl. Examples of the substituent in the substituted aryl group include an alkyl group, a halogen atom, a cyano group, an amino group, an alkoxy group, a phenoxy group, a carboxyl group, an alkoxycarbonyl group, an acyl group, and an amido group.

In the general formula (3), if $R^1$ to $R^3$ each represent an acyl group, examples of the alkyl group and the aryl group in the acyl group include the groups listed for the alkyl group or the aryl group for the above-mentioned $R^1$ to $R^3$.

In the general formula (3), if any two of $R^1$ to $R^3$ and a carbon atom linked thereto form a ring together with a non-metallic atom, the non-metallic atom may be any non-metallic atom having a valency of 2 or more. Examples of useful non-metallic atom include a carbon atom, a nitrogen atom, an oxygen atom, a sulfur atom and a silicon atom.

More specifically, examples of the polymeric compound having as a side chain the structural unit (functional group) represented by the general formula (3) include polymeric compounds which are obtained by a radical polymerization of any of the monomers given below.

Examples of the monomer are the following compounds (monomers (1) to (22)), but the present invention is not limited to these compounds.

(1)

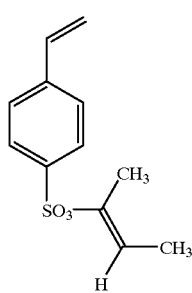

(2)

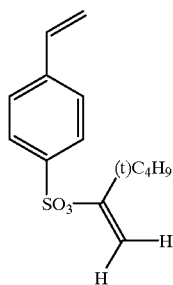

(3)

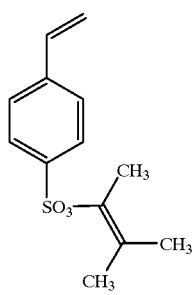

(4)

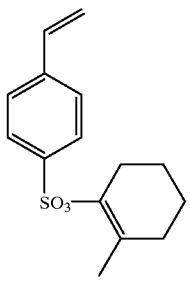

(5)

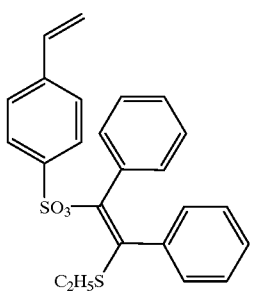

(6)

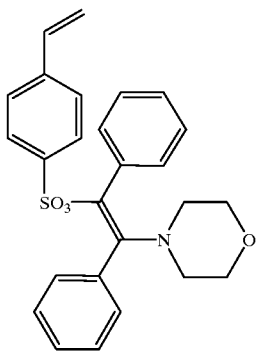

(7)

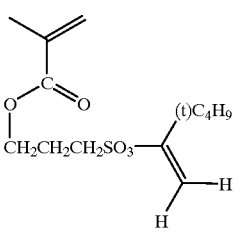

(8) 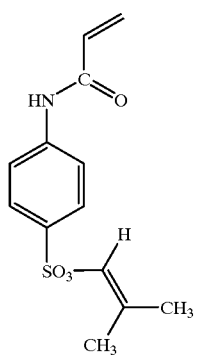
(9) 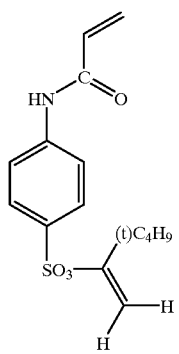
(10) 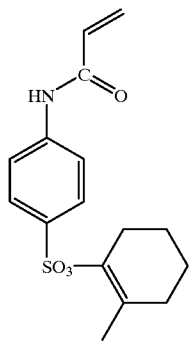
(11) 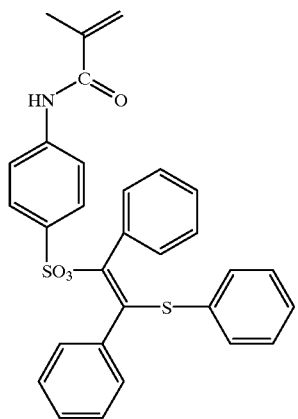
(12) 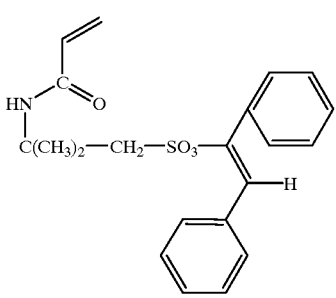
(13) 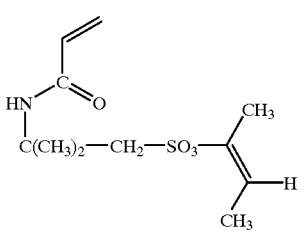
(14) 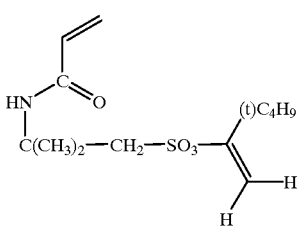
(15) 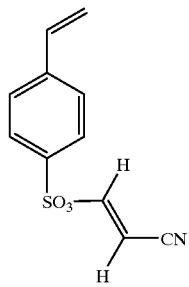
(16) 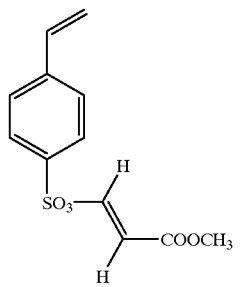

(17)
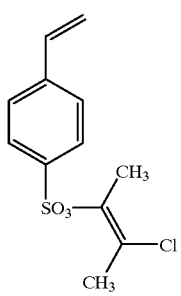

(18)
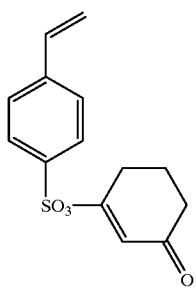

(19)
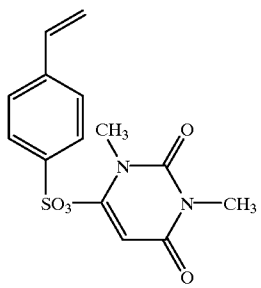

(20)
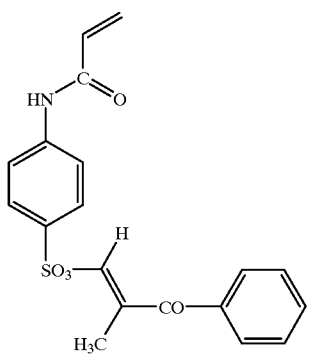

(21)
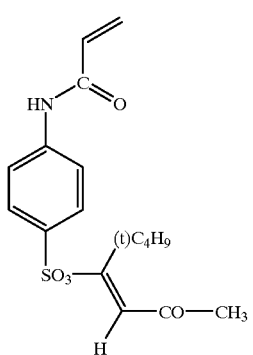

(22)
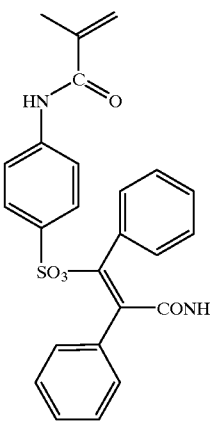

The present invention employs a polymeric compound (hereinafter sometimes referred to as "polymer") which is obtained by a radical polymerization of a monomer having as a side chain the structural unit represented by the general formula (3). However, the polymer may be a copolymer made up of the monomer having as a side chain the structural unit represented by the general formula (3) and another type of monomer.

A desirable polymeric compound for use in the present invention is a copolymer obtained by the previously described radical polymerization of a monomer having as a side chain the structural unit represented by the general formula (3) and another previously described known monomer.

The content of the structural unit represented by the general formula (3) in the copolymer is preferably 5% by weight or more and more preferably 10% by weight or more. If the content is less than 5% by weight, an image may not be formed, whereas, if the content is more than 10% by weight, residual film may remain after the image formation.

In the present invention, the weight average molecular weight of the polymeric compound, which has as a side chain at least one structural unit represented by the general formula (3), is preferably 2,000 or more and more preferably in the range of from 5,000 to 300,000. The number average molecular weight is preferably 800 or more and more preferably in the range of from 1,000 to 250,000. The index of polydispersity (weight average molecular weight/number average molecular weight) is preferably in the range of from 1.1 to 10.

The polymeric compounds may be used singly or in combinations of two or more. The amount added of the polymeric compound in the photosensitive composition of the present invention is in the range of from 50 to 99.9% by weight, more preferably in the range of from 60 to 99% by weight, based on the weight of the total solids of the composition constituting the photosensitive layer of the planographic original plate. If the amount added is less than 50% by weight, the printed image is blurred, whereas, if the amount added is more than 99.9% by weight, a satisfactory image is not formed. An amount in the range of from 60 to 99% by weight leads to the desired sharp image.

Examples of the polymeric compounds (1) to (16) (polymerization units or copolymerization units) are given below, but the present invention is not limited to these examples. The numerals in the formulas indicate the charging percentages (% by weight) of the monomers at the time when synthetic reactions are performed.

(1)
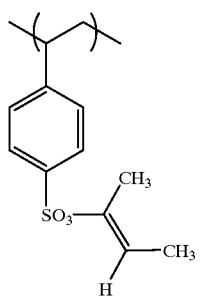
(2)
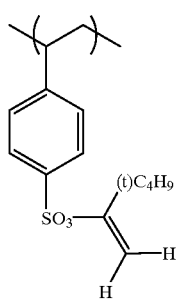
(3)
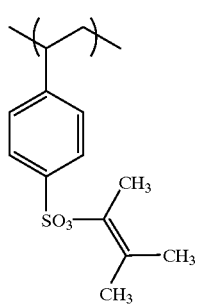
(4)
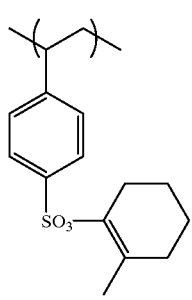
(5)
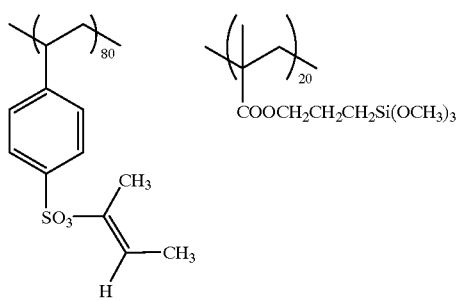
(6)
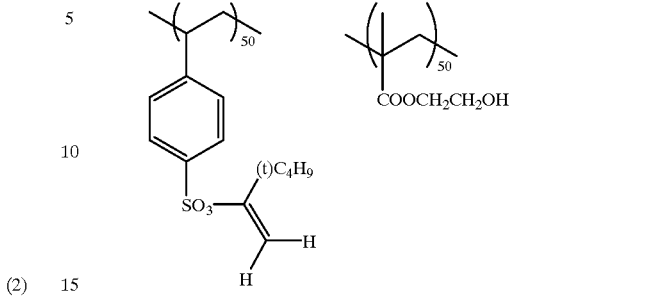
(7)
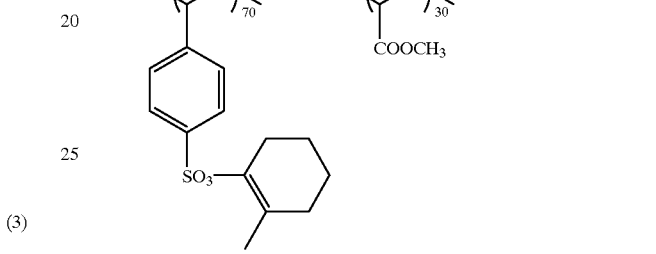
(8)
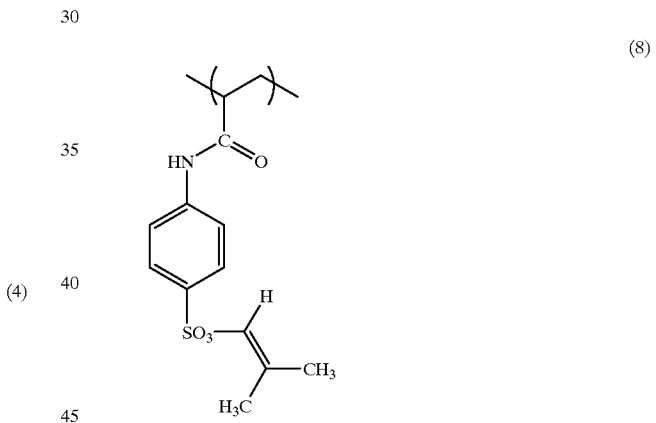
(9)
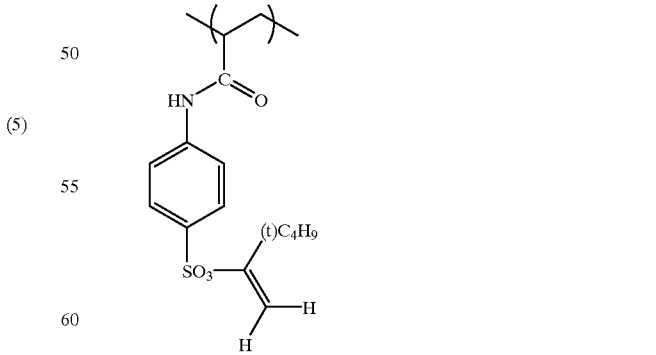

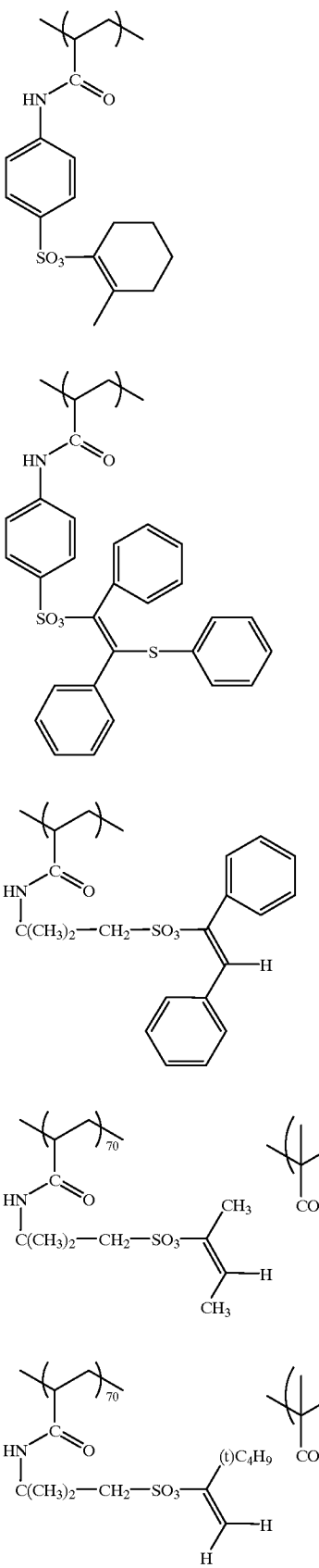

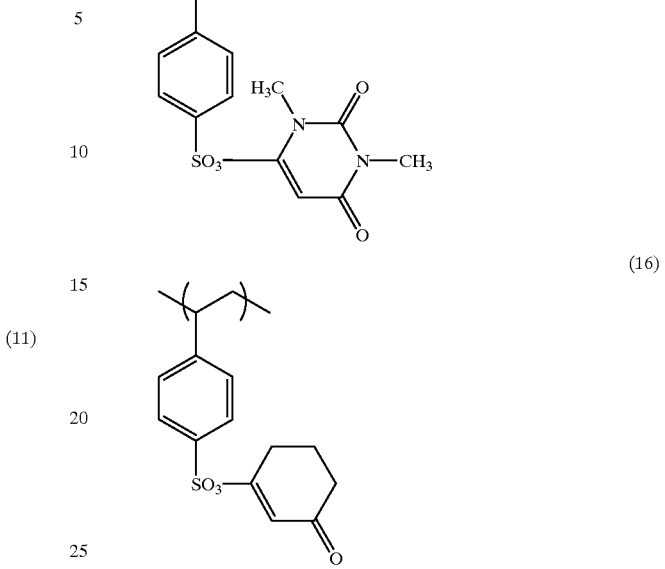

(Acid Generating Agent)

The acid generating agent has the function of generating an acid by the action of light or heat. It is desirable that the acid generating agent is contained in the photosensitive layer, because the acid generating agent increases the sensitivity of the photosensitive layer.

The type of the acid generating agent is not limited provided it has the function of generating an acid by the action of light or heat. Accordingly, the acid generating agent for use in the present invention may be selected from known compounds.

Examples of these compounds include onium salts such as diazonium salts described in, e.g., S. I. Schlesinger, Photogr. Sci. Eng., 18, 387(1974) and T. S. Bal et al, Polymer, 21, 423(1980), ammonium salts described in, e.g., U.S. Pat. Nos. 4,069,055, 4,069,056, and JP-A No. 3-140,140, phosphonium salts described in, e.g., D. C. Necker et al, Macromolecules, 17, 2468(1984), C. S. Wen et al, Teh, Proc. Conf. Rad. Curing ASIA, p.478, Tokyo, October (1988), U.S. Pat. Nos. 4,069,055 and 4,069,056, iodonium salts described in, e.g., J. V. Crivelloetal, Macromolecules, 10(6), 1307(1977), Chem. & Eng. News, p.31 Nov.28, (1988), European Patent No. 104,143, U.S. Pat. Nos. 4,837,124, 339,049, 410,201, JP-A No. 2-150,848 and 2-296,514, sulphonium salts described in, e.g., J. V. Crivello et al, Polymer J. 17, 73 (1985), J. V. Crivello et al, J. Org. Chem., 43, 3055(1978), W. R. Watt et al, J. Polymer Sci. , Polymer Chem. Ed., 22, 1789(1984), J. V. Crivello et al, Polymer Bull., 14, 279(1985), J. V. Crivello et al, Macromolecules, 14(5), 1141(1981), J. V. Crivello et al, J. Polymer Sci., Polymer Chem. Ed., 17, 2877(1979), European Patent No. 370,693, U.S. Pat. No. 3,902,114, European Patent Nos. 233,567, 297,443, 297,442, U.S. Pat. Nos. 4,933,377, 410, 201, 339,049, 4,760,013, 4,734,444, 2,833,827, 2,792,210, 422,570, German Patent Nos. 2,904,626, 3,604,580and 3,604,581, selenonium salts described in, e.g., J. V. Crivello et al, Macromolecules, 10(6), 1307(1977) and J. V. Crivello et al, J. Polymer Sci., Polymer Chem. Ed., 17, 1047(1979), and arsonium salts described in, e.g., C. S. Wen et al, Teh, Proc. Conf. Rad. Curing ASIA, p.478, Tokyo, Oct.(1988); organic halogen compounds described in, e.g., U.S. Pat. No.

3,905,815, Japanese Patent Application Publication (JP-B) No. 46-4,605, JP-A Nos. 48-36,281, 55-32,070, 60-239,736, 61-169,835, 61-169,837, 62-58,241, 62-212,401, 63-70,243 and 63-298,339; organometallic/organic halogen compounds, described in, e.g., K. Meier et al, J. Rad. Curing, 13(4), 26(1986), T. P. Gill et al, Inorg. Chem. , 19, 3007 (1980), D. Astruc, Acc. Chem. Res., 19(12), 377(1896) and JP-A No. 2-161,445; photo-induced acid generating agents having o-nitrobenzyl protective groups described in, e.g., S. Hayase et al, J. Polymer Sci., 25, 753(1987), E. Reichmanis et al, J. Polymer Sci., Polymer Chem. Ed., 23, 1(1985), Q. Q. Zhu et al, J. Photochem., 36, 85, 39, 317(1987), B. Amit et al, Tetrahedron Lett., (24) 2205, (1973), D. H. R. Barton et al, J. Chem. Soc., 3571(1965), P. M. Collins et al, J. Chem. Soc., Perkin I, 1695(1975), M. Rudinstein et al, Tetrahedron Lett., (17), 1445 (1975), J. W. Walker et al, J. Am. Chem. Soc., 110, 7170(1988), S. C. Busman et al, J. Imaging Technol., 11(4), 191(1985), H. M. Houlihan et al, Macromolecules, 21, 2001(1988) P. M. Collins et al, J. Chem. Soc., Chem. Commun., 532(1972), S. Hayase et al, Macromolecules, 18, 1799(1985), E. Reichmanis et al, J. Electrochem. Soc., Solid State Sci. Technol., 130(6), F. M. Houlihan et al, Macromolecules, 21, 2001(1988), European Patent Nos. 0, 290,750, 046,083, 156,535, 271,851, 0,388, 343, U.S. Pat. Nos. 3,901,710, 4,181,531, JP-A Nos. 60-198, 538 and 53-133,022; compounds such as iminosulfonates which undergo photolysis to generate sulfonic acid and are described in, e.g., M. Tunooka et al, Polymer Preprints Japan, 35(8), G. Berner et al, J. Rad. Curing, 13 (4), W. J. Mijs et al, Coating Technol., 55(697), 45(1983), AKZO, H. Adachi et al, Polymer Preprints, Japan, 37(3), European Patent Nos. 0, 199,672, 84,515, 199,672, 044,115, 0,101, 122, U.S. Pat. Nos. 4,618,564, 4,371,605, 4,431,774, JP-A Nos. 64-18,143, 2-245,756, 4-365,048 and Japanese Patent Application No. 3-140,109; disulfone compounds described in JP-A No. 61-166,544; o-naphthoquinone diazide-4-sufonic acid halides described in JP-A No. 50-36,209(U.S. Pat. No. 3,969,118); and o-naphthoquinone diazide compounds described in JP-A No. 55-62,444(U. K. Patent No. 2,038,801) and JP-B No. 1-11,935.

Other acid generating agents include alkyl sulfonates, such as cyclohexyl citrate, cyclohexyl p-acetaminobenzenesulfonate, and cyclohexyl p-bromobenzenesulfonate along with the alkyl sulfonate which is described in Japanese Patent Application No. 9-26,878 by the present inventors and represented by the following structural formula.

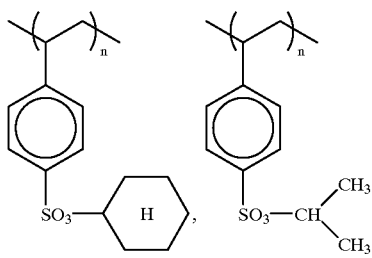

In the present invention, the polymeric compounds having as a side chain any structural unit represented by the general formulas (1) to (3) may decompose by the action of heat and function as an acid generating agent. In this case, image formation is possible without the use of other acid generating agents.

Among these acid generating agents, particularly effective ones are described be low.

(1) Trihalomethyl-substituted oxazole derivatives represented by the following general formula (PAG 1) or S-triazine derivatives represented by the following general formula (PAG 2)

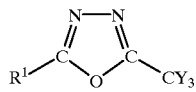
(PAG1)

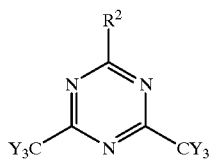
(PAG2)

In these formulas, $R^1$ represents a substituted or unsubstituted aryl group or alkenyl group. $R^2$ represents a substituted or unsubstituted aryl, alkenyl, or alkyl group or —$CY_3$. Y represents a chlorine atom or a bromine atom.

Specific examples of these compounds are given below, but the present invention is not limited to these compounds.

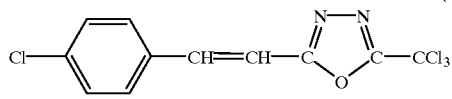
(PAG1-1)

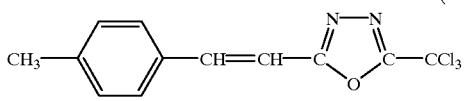
(PAG1-2)

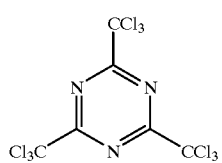
(PAG2-1)

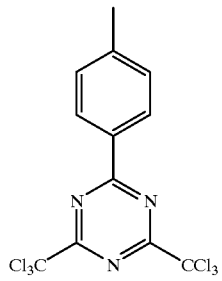
(PAG2-2)

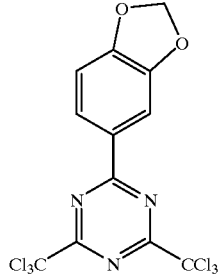
(PAG2-3)

-continued (PAG2-4)

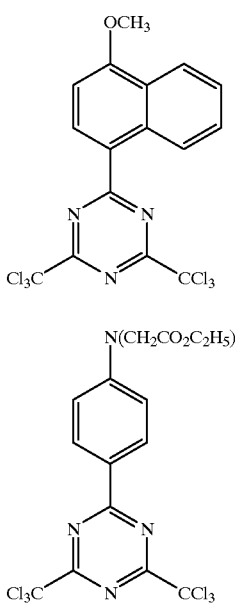

(PAG2-5)

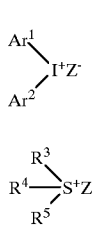

(2) Iodonium salts represented by the following general formula (PAG 3) or sulphonium or diazonium salts represented by the following general formula (PAG 4)

(PAG3)

$$Ar^1{\phantom{X}}\!\!\!\!\!\!\!\!\!\!\!\!\!\!\!>\!I^+Z^-$$
$$Ar^2$$

(PAG4)

$$R^3$$
$$R^4\!\!-\!\!S^+Z^-$$
$$R^5$$

In these formulas, $Ar^1$ and $Ar^2$ each independently represent a substituted or unsubstituted aryl group. Examples of preferred substituents include an alkyl group, a haloalkyl group, a cycloalkyl group, an aryl group, an alkoxy group, a nitro group, a carboxyl group, an alkoxycarbonyl group, a hydroxy group, a mercapto group, and a halogen atom.

$R^3$, $R^4$ and $R^5$ each independently represent a substituted or unsubstituted alkyl or aryl group. Preferably, $R^3$, $R^4$ and $R^5$ each represent an aryl group having 6 to 14 carbon atoms, an alkyl group having 1 to 8 carbon atoms, or a substituted derivative thereof. Examples of preferred substituents in the aryl group include an alkoxy group having 1 to 8 carbon atoms, an alkyl group having 1 to 8 carbon atoms, a nitro group, a carboxyl group, a hydroxy group and a halogen atom. Examples of preferred substituents in the alkyl group include an alkoxy group having 1 to 8 carbon atoms, a carboxyl group, and an alkoxycarbonyl group.

$Z^-$ represents a counter anion. Nonlimiting examples of $Z^-$ include $BF_4^-$, $AsF_6^-$, $PF_6^-$, $SbF_6^-$, $SiF_6^-$, $ClO_4^-$, a perfluoroalkanesulfonate anion such as $CF_3SO_3^-$, a pentafluorobenzenesulfonate anion, a bonded polynuclear aromatic sulfonate anion such as a naphthalene-1-sulfonate anion, an anthraquinonesulfonate anion, and a dye having a sulfonic acid group.

Two of $R^3$, $R^4$ and $R^5$ as well as $Ar^1$ and $Ar^2$ are may be linked to each other via a single bond or a substituent group.

Specific examples of these compounds are given below, but the present invention is not limited to these compounds.

(PAG3-1)

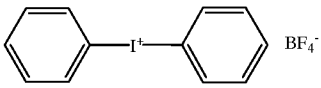

(PAG3-2)

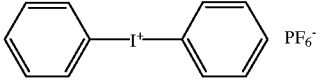

(PAG4-1)

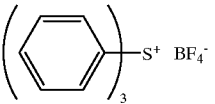

(PAG4-2)

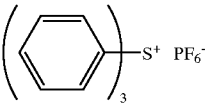

(PAG4-3)

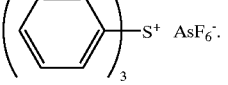

The onium salts represented by the general formulas (PAG 3) and (PAG4) are well known and can be synthesized by any of the methods described in, e.g., J. W. Knapczyk et al, J. Am. Chem. Soc., 91, 145(1969), A. L. Maycok et al, J. Org. Chem., 35, 2532, (1970), B. Goethas et al, Bull. Soc. Chem. Belg., 73, 546, (1964), H. M. Leicester, J. Ame. Chem. Soc., 51, 3587(1929), J. V. Crivello et al, J. Polym. Chem. Ed., 18, 2677(1980), U.S. Pat. Nos. 2,807,648, 4,247,473, and JP-A No. 53-101,331.

(3) Disulfone derivatives represented by the following general formula (PAG 5) or iminosulfonate derivatives represented by the following general formula (PAG 6)

(PAG5)

$$Ar^3\!-\!SO_2\!-\!SO_2\!-\!Ar^4$$

(PAG6)

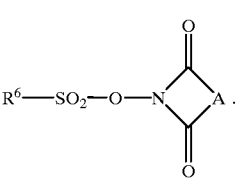

In these formulas, $Ar^3$ and $Ar^4$ each independently represent a substituted or unsubstituted aryl group. $R^6$ represents a substituted or unsubstituted alkyl or aryl group. A represents a substituted or unsubstituted alkylene, alkenylene, or arylene group.

Specific examples of these compounds are given below, but the present invention is not limited to these compounds.

(PAG5-1)

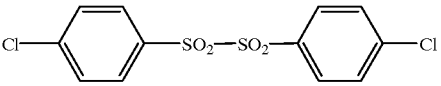

-continued

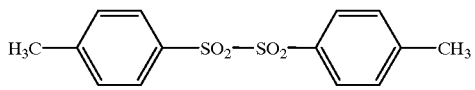
(PAG5-2)

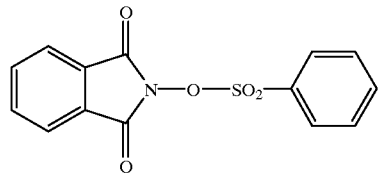
(PAG6-1)

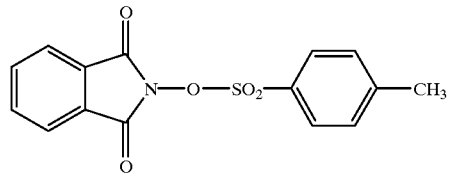
(PAG6-2)

The content of the acid generating agent in the photosensitive composition of the present invention is usually in the range of from 0.1 to 30% by weight, more preferably in the range of from 1 to 15% by weight, based on the weight of the total solids of the composition constituting the photosensitive layer of the planographic original plate. If the content is less than 1% by weight, the sensitivity may decrease, whereas, if the content is more than 15% by weight, the strength of the image may decrease.

(Infrared Absorber)

Examples of the infrared absorber are a dye or a pigment each capable of effectively absorbing infrared rays having wavelengths in the range of from 760 nm to 1200 nm. Preferably, the infrared absorber is a dye or a pigment each having a peak of absorption in the range of from 760 nm to 1200 nm.

The dyes suitable for use in the present invention are commercially available dyes and those described in, for example, "Handbook of Dyes", edited by Association of Organic Synthesis (Yuki Cosei Kagaku Kyokai) (1970). Specific examples of the dyes include azo dyes, azo dyes in the form of a metallic complex salt, pyrazolone azo dyes, anthraquinone dyes, phthalocyanine dyes, carbonium dyes, quinonimine dyes, methine dyes, cyanine dyes, and dyes in the form of a metallic thiolate complex.

Preferred examples of the dyes include cyanine dyes described in, e.g., JP-A Nos. 58-125,246, 59-84,356, 59-202,829 and 60-78,787, methine dyes described in, e.g., JP-A Nos. 58-173,696, 58-181,690 and 58-194,595, naphthoquinone dyes described in, e.g., JP-A Nos. 58-112,793, 58-224,793, 59-48,187, 59-73,996, 60-52,940, and 60-63,744, squalylium dyes described in JP-A No. 58-112,792, and cyanine dyes described in U. K. Patent No. 434,875.

Other suitable compounds are a near-infrared absorbing sensitizer described in U.S. Pat. No. 5,156,938, a substituted arylbenzo(thio)pyrylium salt described in U.S. Pat. No. 3,881,924, a trimethinethiapyrylium salt described in JP-A No. 57-142,645 (U.S. Pat. No. 4,327,169), pyrylium compounds described in JP-A Nos. 58-181,051, 58-220,143, 59-41,363, 59-84,248, 59-84,249, 59-146,063 and 59-146,061, a cyanine dye described in JP-A No. 59-216,146, a pentamethinethiopyrylium salt described in U.S. Pat. No. 4,283,475, and pyrylium compounds described in JP-B No. 5-13,514 and 5-19,702.

Further examples of the preferred dyes are near-infrared absorbing dyes represented by the formulas (I) and (II) in U.S. Pat. No. 4,756,993.

Among these dyes, cyanine dyes, squalylium dyes, pyrylium dyes, and nickel thiolate complexes are particularly preferable.

The pigments suitable for use in the present invention are commercially available pigments and those described in, for example, "Color Index Handbook(C. I.)", "Latest Pigment Handbook" (Saishin Ganryo Binran) edited by Japan Association of Pigment Technologies (Nihon Ganryo Gijutsu Kyokai) (1977), "Latest Pigment Application Technologies" (Saishin Ganryo Oyo Gijutsu), CMC, 1986 and "Printing Ink Technologies" (Insatsu Inki Gijutsu), CMC, 1984.

Examples of the pigments include black pigments, yellow pigments, orange pigments, brown pigments, red pigments, purple pigments, blue pigments, green pigments, fluorescent pigments, metal powder pigments, polymers containing chemically combined dyes. Specific examples of the pigments are insoluble azo pigments, azo lake pigments, condensed azo pigments, chelated azo pigments, phthalocyanine based pigments, anthraquinone based pigments, perylene and perinone based pigments, thioindigo based pigments, quinacridone based pigments, dioxazine based pigments, isoindolinone based pigments, quinophthalone based pigments, dyed lake pigments, azine pigments, nitroso pigments, nitro pigments, natural pigments, fluorescent pigments, inorganic pigments, carbon black and the like. Among these pigments, carbon black is preferable.

These pigments may be used without being surface-treated or may be used after being surface treated. Possible surface treatments include a treatment wherein a resin or a wax is coated on the surface of the pigments, a treatment wherein a surfactant is adhered to the surface of the pigments, and a treatment wherein a reactive substance (e.g., a silane coupling agent, an epoxy compound, or a polyisocyanate) is bound to the surface of the pigments. These surface-treating methods are described in "Properties and Applications of Metal Soaps" (Saiwai Shobo Co., Ltd.), "Printing Ink Technologies" (Insatsu Inki Gijutsu) CMC, 1984 and "Latest Pigment Application Technologies" (Saishin Ganryo Oyo Gijutsu), CMC, 1986.

The diameter of the pigments is preferably 0.01 to 10 $\mu$m, more preferably 0.05 to 1 $\mu$m, and most preferably 0.1 to 1 $\mu$m.

If the diameter is less than 0.01 $\mu$m, the dispersion stability of the pigments in a coating liquid comprising a photosensitive composition is insufficient, whereas, if the diameter is greater than 10 $\mu$m, the uniformity of the image recording layer after coating thereof is poor.

A known dispersing technology using a dispersing machine employed in the preparation of ink and toners can also be used for the purpose of dispersing the pigments. Examples of the dispersing machine include an ultrasonic wave dispersing machine, a sand mill, an attritor, a pearl mill, a super mill, a ball mill, an impeller, a disperser, a KD mill, a colloid mill, a dynatron, a three-roller mill, a pressurized kneader, and the like. Details of these dispersing technologies are described in "Latest Pigment Application Technologies" (Saishin Ganryo Oyo Gijutsu), CMC, 1986.

The amounts added of the dye and the pigment in the photosensitive layer are each in the range of from 0.01 to 50% by weight, more preferably in the range of from 0.1 to 10% by weight, based on the weight of the total solids of the composition constituting the photosensitive layer. Most preferably, the amount added of the dye is in the range of from 0.5 to 10% by weight, while the amount of the pigment is in the range of from 1.0 to 10% by weight. If the amount added is less than 0.01% by weight, the sensitivity of the photosensitive layer may decrease, whereas, if the amount added is more than 50% by weight, non-image areas tend to be smudgy.

(Other components)

Other components are not particularly limited and are used according to need. For example, if the acid generating agent is not sensitive to light in a visible region, a sensitizing dye for the acid generating agent may be used so as to activate the acid generating agent to the light in a visible region.

Examples of these sensitizing dyes effectively used for this purpose include a pyran dye described in U.S. Pat. No. 5,238,782, a cyanine dye and a squalylium dye described in U.S. Pat. No. 4,997,745, a merocyanine based dye described in U.S. Pat. No. 5,262,276 and a pyrylium dye described in JP-B No. 8-20,732 as well as Michler's ketone, thioxanthone, a ketocoumarin dye, and 9-phenylacridine. Other dyes that can be used are polynuclear aromatic compounds such as bisbenzilideneketone and 9,10-diphenylanthracene described in U.S. Pat. No. 4,987,230.

As further examples of the other components, dyes which have a large percentage of absorption in a visible light region can be used as an image coloring agent.

Specific examples include Oil Yellow No. 101, Oil Yellow No. 103, Oil Pink No. 312, Oil Green BG, Oil Blue BOS, Oil Blue No. 603, Oil Black BY, Oil Black BS, and Oil Black T-505 (all manufactured by Orient Chemical Industries, Co., Ltd.), Victoria Pure Blue, Crystal Violet(C. I. 42555), Methyl Violet (C. I. 42535), Ethyl Violet, Rhodamine B(C. I. 145170B) Malachite Green (C. I. 42000), Methylene Blue (C. I. 52015), and the like, along with dyes described in JP-A No. 62-293,247 and Japanese Patent Application No. 7-335,145.

The amount added of the dye is in the range of from 0.01 to 10% by weight based on the weight of the total solids of the composition constituting the photosensitive layer.

Further, in order to broaden the latitude of stable printing conditions, the composition constituting the photosensitive layer may contain a nonionic surfactant as described in JP-A Nos. 62-251,740 and 3-208,514 and an amphoteric surfactant as described in JP-A Nos. 59-121,044 and 4-13,149.

Specific examples of the nonionic surfactant include sorbitan tristearate, sorbitan monopalmitate, sorbitan trioleate, monoglyceride stearate, and polyoxyethylene nonylphenyl ether.

Specific examples of the amphoteric surfactant include alkyldi(aminoethyl)glycine, hydrochloric acid salt of alkylpolyaminoethylglycine, 2-alkyl-N-carboxyethyl-N-hydroxyethylimidazolinium betaine, and N-tetradecyl-N,N-betaine (e.g., Amogen K (Trade name) manufactured by Dai-ichi Kogyo Seiyaku Co., Ltd.).

The preferred amounts added of the nonionic surfactant and the amphoteric surfactant are each in the range of from 0.05 to 15% by weight, more preferably from 0.1 to 5% by weight, based on the weight of the total solids of the composition constituting the photosensitive layer.

In order to impart flexibility to the coating layer, a plasticizer is incorporated into the composition for the photosensitive layer. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid.

The photosensitive layer is usually formed by coating a coating liquid, which is prepared by dissolving the above-described components in a known solvent, on an appropriate substrate.

Examples of the solvent include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butylolactone, toluene, and water.

These solvents may be used singly or in combinations of two or more. The concentration of the total components (total solids including additives) in the coating liquid is preferably in the range of from 1 to 50% by weight. The desirable coated amount (solids) after coating and drying on the substrate is generally in the range of from 0.5 g to 5.0 $g/m^2$.

The coating liquid can be applied by various methods. Examples of the methods include bar coating, rotational coating, spraying, curtain coating, dipping, air-knife coating, blade coating, and roll coating.

In order to improve the coatability, the composition for the photosensitive layer may contain a surfactant. An example of this surfactant is a fluorine-containing surfactant described in JP-A No. 62-170,950. The preferred amount added of the surfactant is in the range of from 0.01 to 1% by weight, more preferably from 0.05 to 0.5% by weight, based on the weight of the total solids of the composition constituting the photosensitive layer.

A substrate for use in the planographic original plate of the present invention may be a dimensionally stable plate which has been conventionally employed.

Specific examples of the substrate include paper, paper laminated with a plastic (e.g., polyethylene, polypropylene and polystyrene), metal plates such as aluminum(including aluminum alloy), zinc, iron and copper, plastic films such as diacetylcellulose, triacetylcellulose, cellulose propionate, cellulose butyrate, cellulose butyrate acetate, cellulose nitrate, polyethylene terephthalate, polyethylene, polystyrene, polypropylene, polycarbonate, and polyvinyl acetal, and paper or plastic films laminated or vapor-deposited with the aforementioned metals. Among these materials, an aluminum plate is particularly preferable. Examples of the aluminum plate include a pure aluminum plate and an aluminum alloy plate. Examples of the aluminum alloys are alloys of aluminum with a metal such as silicon, copper, manganese, magnesium, chromium, zinc, lead, bismuth and nickel. These alloys may contain small amounts of iron and titanium along with other negligible amounts of impurities.

If necessary, the substrate is surface-treated. For example, the surface of the substrate is rendered hydrophilic by the surface treatment.

In the case of a substrate whose surface is a metal, aluminum in particular, it is desirable that the surface undergo a surface treatment such as graining, immersion in an aqueous solution of, for example, sodium silicate, potassium fluorozirconate, or phosphate, or anodizing. Preferred examples are a treatment wherein an aluminum plate after graining is immersed in an aqueous solution of sodium silicate as described in U.S. Pat. No. 2,714,066 and a treatment wherein an aluminum plate after anodizing is immersed in an aqueous solution of an alkali metal silicate as described in U.S. Pat. No. 3,181,461. The anodizing is performed by passing an electric current through an electrolyte solution using the aluminum plate as an anode comprising a single, or two or more aqueous or nonaqueous solutions containing, for example, an inorganic acid such as phosphoric acid, chromic acid, sulfuric acid, and boric acid, an organic acid such as oxalic acid and sulfamic acid, or a salt thereof.

Also, an electrodeposition of a silicate as described in U.S. Pat. No. 3,658,662 is effective.

The purposes of these treatments are to render the substrate surface hydrophilic, and to prevent an undesirable reaction between the substrate surface and the photosensitive composition formed thereon, or to increase the adhesion between the substrate surface and the photosensitive composition formed thereon.

If necessary, it is also possible to remove any rolling oil and expose the clean aluminum surface as a pretreatment prior to the graining of the aluminum plate. For the purpose of removing the rolling oil, a solvent such as trichloroethylene, a surfactant, or the like is used. For the purpose of exposing a clean surface, an alkali etching process using sodium hydroxide, potassium hydroxide, or the like is widely employed.

Examples of effective graining include a mechanical method, a chemical method, and an electrochemical method.

Examples of the mechanical method include ball abrasion, blasting abrasion, and brush abrasion wherein the surface is abraded with a nylon brush using a water-dispersed slurry of an abrasive such as pumice.

Exemplary of the chemical method is immersion in a saturated aqueous solution of an aluminum salt of a mineral acid as described in JP-A No. 54-31,187.

Exemplary of the electrochemical method is electrolysis by an a. c. current in an acidic electrolyte solution of hydrochloric acid, nitric acid, or a combination thereof.

Among these methods for roughening the surface of aluminum, the most preferred is a method comprising a combination of mechanical roughening and electrochemical roughening as described in JP-A No. 55-137,993, because this method increases the bonding strength of a sensitive image to the substrate.

Desirably, the graining is performed in such a way that the average roughness (Ra) along the center line on the aluminum plate is in the range of from 0.3 to 1.0 $\mu$m.

After the graining, the aluminum plate is subjected to water-rinsing or chemical etching.

A treating solution for etching is usually selected from an aqueous solution of a base or an acid capable of dissolving aluminum. After the treatment, the etched surface must have a coating film thereon which derives from the components of the etching solution and is different from aluminum. Examples of preferred etching agents which are basic substances include sodium hydroxide, potassium hydroxide, trisodium phosphate, disodium phosphate, tripotassium phosphate, and dipotassium phosphate. Examples of etching agents which are acidic substances include sulfuric acid, persulfuric acid, phosphoric acid, hydrochloric acid, and salts thereof. However, salts of metals, such as zinc, chromium, cobalt, nickel and copper, having an ionizing tendency lower than that of aluminum are not desirable, because these salts produce an unnecessary film on the etched surface.

A desirable etching process is such that the dissolution rate of aluminum or an aluminum alloy is 0.3 to 40 g/m$^2$ for each minute of immersion at a concentration and a temperature selected for the process. However, a higher or a lower dissolution rate may be adopted.

The etching is performed either by immersing an aluminum plate in the etching solution or by coating the etching solution on the aluminum plate. The desirable etched amount by the etching process is 0.5 to 10 g/m$^2$.

Because of its higher etching speed, the use of an aqueous solution of a base as an etching agent is preferable. In this case, since smut is formed, a de-smutting treatment is usually employed. Examples of the acid to be used for the de-smutting process include nitric acid, sulfuric acid, phosphoric acid, chromic acid, hydrofluoric acid, and fluoroboric acid.

After the etching, the aluminum plate is subjected to water-rinsing and anodizing, if necessary.

The anodizing may be performed according to a process conventionally employed in this field. More specifically, the anodizing is performed by passing a d. c. or an a. c. current through an aluminum plate in an electrolyte solution comprising a single, or two or more aqueous or nonaqueous solutions containing, for example, an acid such as sulfuric acid, phosphoric acid, chromic acid, oxalic acid, sulfamic acid and benzenesulfonic acid. The anodizing film is then formedon the surface of the aluminum substrate.

Conditions for the anodizing vary depending on the type of electrolyte solution employed and cannot be stipulated unqualifiedly. However, usually employed conditions are as follows: concentration of the electrolyte solution is 1 to 80% by weight; temperature of the solution is 5 to 70° C.; current density is 0.5 to 60 A/dm$^2$; voltage is 1 to 100 V; and duration of the electrolysis is 30 seconds to 50 minutes.

Preferred examples of the anodizing include a process wherein an aluminum plate is anodized in an aqueous solution of sulfuric acid by a high current density as described in U. K. Patent No. 1,412,768 and a process wherein an aluminum plate is anodized in an aqueous solution of phosphoric acid as described in U.S. Pat. No. 3,511,661.

If necessary, the substrate whose surface is roughened and anodizedmaybe renderedhydrophilic bya surface treatment. Preferred examples of this surface treatment include treating the surface with an aqueous solution of an alkali metal silicate, such as sodium silicate, as described in U.S. Pat. Nos. 2,714,066 and 3,181,461, treating the surface with an aqueous solution of potassium fluorozirconate as described in JP-B No. 36-22,063 and treating the surface with an aqueous solution of polyvinylsulfonic acid as described in U.S. Pat. No. 4,153,461.

Prior to the coating of the photosensitive layer on a substrate for the preparation of the planographic original plate of the present invention, it is desirable to provide an organic subbing layer on the substrate so as to decrease the amount of residual photosensitive layer in non-image areas.

An organic compound for use in the organic subbing layer is selected from the group consisting of carboxymethyl cellulose, dextrin, gum arabic, phosphonic acids such as 2-aminoethylphosphonic acid having an amino group, organic phosphonic acids such as phenylphosphonic acid which may have a substituent, naphthylphosphonic acid, alkylphosphonic acid, glycerophosphonic acid, methylene-diphosphonic acid, and ethylenediphosphonic acid, organic phosphoric acids such as phenylphosphoric acid which may have a substituent, naphthylphosphoric acid, alkylphosphoric acid, and glycerophosphoric acid, organic phosphinic acids such as phenylphosphinic acid which may have a substituent, naphthylphosphinic acid, alkylphosphinic acid, and glycerophosphinic acid, amino acids such as glycine and alanine, hydrochloric acid salts of amines having a hydroxyl group such as triethanolamine. These compounds may be used singly or may be used in combinations of two or more. Further, a polymeric compound having a structural unit such as poly(p-vinylbenzoic acid) may also be used.

The subbing layer may be formed by any method described below. For example, the above-mentioned organic compound is dissolved in water, an organic solvent such as methanol, ethanol or methyl ethyl ketone, or a mixture thereof to prepare a coating solution, and thereafter the coating solution is coated on an aluminum plate to provide a subbing layer which is then dried. Alternatively, the above-mentioned organic compound is dissolved in water, an organic solvent such as methanol, ethanol or methyl ethyl ketone, or a mixture thereof to prepare a coating solution, and thereafter an aluminum plate is immersed in the coating solution so that the organic compound is adsorbed on the surface of the aluminum plate to form a subbing layer which is then water-rinsed and dried. When the former method is employed, a solution containing 0.005 to 10% by weight of the organic compound can be applied by a variety of methods. Examples of the methods include bar coating, rotational coating, spraying, and curtain coating. When the latter method is employed, the parameters of the conditions are as follows: concentration of the solution is 0.01 to 20% by weight and preferably 0.05 to 5% by weight; immersion temperature is 20 to 90° C. and preferably 25 to 50° C.; and immersion time is 0.1 second to 20 minutes and preferably 2 seconds to 1 minute.

The pH of the coating solution may be adjusted to from 1 to 12 by use of a base such as ammonia, triethylamine or potassium hydroxide or an acid such as hydrochloric acid or phosphoric acid. Further, a yellow dye may be incorporated into the coating solution so as to improve the reproducibility of the surface characteristics of the photosensitive planographic printing plate.

The desirable coated amount after drying of the organic subbing layer is in the range of from 2 to 200 mg/m$^2$ and preferably in the range of from 5 to 100 mg/m$^2$. If the coated amount is less than 2 mg/m$^2$, a sufficient printing durability may not be obtained. On the other hand, if the coated amount exceeds 200 mg/m$^2$ the same undesirable result may occur.

On the reverse side of the substrate, a back coat may be formed, if necessary.

Preferred examples of the back coat are a coating layer obtained by an organic polymeric compound described in JP-A No. 5-45,885 and a coating layer which comprises a metallic oxide and is obtained by hydrolyzing an organic or inorganic metallic compound and polycondensing the resulting product as described in JP-A No. 6-35,174.

Among these coating layers, layers made from alkoxy compounds of silicon such as $Si(OCH_3)_4$, $Si(OC_2H_5)_4$, $Si(OC_3H_7)_4$ and $Si(OC_4H_9)_4$ are particularly preferable, because these compounds are inexpensive and the coating layers of metal oxides made from these compounds are excellent in hydrophilicity.

The planographic original plate of the present invention can be prepared as described above. The planographic original plate is exposed image-wise by means of a solid laser or a semiconductor laser emitting infrared rays having wavelengths of 760 to 1200 nm. In the present invention, two procedures are possible, i.e., a procedure wherein, after the laser irradiation, the plate is water-processed, gum-coated if necessary, and then mounted on a printing machine so that printing is started, and a procedure wherein, directly after the laser irradiation, the plate is mounted on a printing machine so that printing is started. However, it is desirable to carry out a thermal treatment after the laser irradiation in both procedures. Preferred conditions for the thermal treatment are from 80 to 150° C. and from 10 seconds to 5 minutes. This thermal treatment makes it possible to reduce the amount of laser energy required for recording.

The planographic original plate obtained by the process described above is mounted on an offset printing machine either after water-processing or without water-processing, and the printing machine is used for printing a large number of sheets.

EXAMPLES

In order that those skilled in the art will be better able to practice the present invention, the following examples are given by way of illustration and not by way of limitation. (Synthesis of a polymeric compound having as a side chain the structural unit represented by the general formula (1)) Synthesis of a monomer (1) indicated by the formula 3

90 g of p-(t-butoxycarbonyloxy)benzyl alcohol, 300 mL of acetonitrile, and 130 g of pyridine were placed in a 1000 mL three-neck flask, and a solution was produced. Then, 71 g of styrenesulfonyl chloride was added dropwise to the solution while it was being stirred and cooled by ice. After the completion of the addition, the reaction solution was stirred for 5 hours at the same temperature. Then, the reaction solution was poured into 1,000 g of ice water containing 135 mL of concentrated hydrochloric acid. The mixture was extracted with ethyl acetate. After being washed with water, the solution in ethyl acetate was dried by magnesium sulfate and the solvent was removed from the solution at a reduced pressure. The residue was purified by means of silica gel in a column.

Results of elemental analysis of the monomer (1) obtained were as follows: C: 61.73% and H: 5.51% (theoretical C: 61.52% and H: 5.68%).
Synthesis of a Polymer (1)

20 g of the monomer (1) and 40 g of methyl ethyl ketone were placed in a 200 mL three-neck flask, and a solution was produced. Then, the temperature of the solution was raised to 65° C. At this temperature, 0.25 g of azobisdimethylvaleronitrile was added to the solution under a nitrogen stream. The reaction mixture was stirred for 5 hours while being kept at 65° C. After this reaction time, the solvent was removed at a reduced pressure to obtain a solid reaction product. As a result of GPC analysis, this reaction product was found to be a polymer having a weight average molecular weight of 15,200.
Synthesis of Polymers (2) to (8)

Polymers (2) to (8) were prepared by repeating the procedure for the synthesis of the polymer (1), except that the monomer (1) as used therein was replaced with the respective monomers (indicated by the formulas 3 to 4) shown in Table 1 given below. Average molecular weights of the polymers obtained are shown in Table 1.

TABLE 1

| | Monomers employed | Weight average molecular weight |
|---|---|---|
| Polymer (2) | Monomer (2) 20 g | 16,000 |
| Polymer (3) | Monomer (3) 20 g | 18,000 |
| Polymer (4) | Monomer (9) 20 g | 20,000 |
| Polymer (5) | Monomer (1) 16 g + 3-trimethoxysilylpropyl methacrylate | 12,000 |
| Polymer (6) | Monomer (6) 20 g | 18,000 |
| Polymer (7) | Monomer (1) 16 g + Glycidyl methacrylate 4 g | 10,000 |
| Polymer (8) | Monomer (8) 20 g | 30,000 |

Examples 1 to 8

A 0.30 mm thick aluminum plate (type of material: 1050) was cleaned with trichloroethylene and grained with a nylon brush using an aqueous suspension of 400 mesh pumice powder. After being well rinsed with water, the aluminum plate was etched by a process comprising the steps of immersing the aluminum plate in a 25% aqueous solution of sodium hydroxide at 45° C. for 9 seconds, rinsing the aluminum plate with water, immersing the aluminum plate in a 2% aqueous solution of $HNO_3$ for 20 seconds and rinsing the aluminum plate with water. In the process, the etched amount of the grained aluminum plate was about 3 g/m². After the process, the aluminum plate was subjected to an anodizing process comprising immersing the aluminum plate in a 7% $H_2SO_4$ electrolyte solution through which a d. c. current with a current density of 15A /dm² was passed. This process produced an anodized film of 2.4 g/m². Then, the surface-treated aluminum plate was rinsed with water and thereafter dried.

According to the formulation of a solution (A) given below, 8 solutions, namely (A-1) to (A-8) were prepared by using a relevant polymer, having as a side chain the structural unit represented by the general formula (1), as shown in Table 1, wherein the polymer was selected from the above-mentioned polymers (1) to (8).

After the preparation of the solutions, the solutions were coated, respectively, on the surface-treated aluminum plates. The coated layers were dried at 80° C. for 3 minutes. In this way, planographic original plates (A-1) to (A-8) were obtained. After drying, the coated amount was 1.2 g/m².

| Solution (A) | in grams |
|---|---|
| Polymeric compound for use in the present invention (polymer (1) to polymer (8)) | 4.0 |
| Infrared ray absorber IR-125 (manufactured by Wako Junyaku, Ltd.) | 0.15 |
| Acid generating agent: diphenyliodonium anthraquinonesulfonate | 0.15 |
| A dye prepared by using 1-naphthalenesulfonic acid as the counter ion of Victoria Pure Blue BOH | 0.05 |
| Megafac F-177 (a fluorine-based surfactant manufactured by Dainippon Ink and Chemicals Inc.) | 0.06 |
| Methyl ethyl ketone | 20 |
| γ-butylolactone | 10 |
| 1-methoxy-2-propanol | 8 |
| Water | 2 |

The planographic original plates (A-1) to (A-8) were exposed image-wise to a YAG laser emitting infrared rays having a wavelength of 1064 nm. After the exposure, the planographic original plates (A-1) to (A-8) were each divided into 4 sections. Then, each printing plate was printed according to the following conditions.

(A) Water-developing and printing using a Hidel SOR-M
(B) Thermal treating at 100IC for 3 minutes followed by water-developing and printing using a Hidel SOR-M
(C) The plates were printed without any further treatment using a Hidel SOR-M
(D) Thermal treating at 100° C. for 3 minutes and printing using a Hidel SOR-M The prints were inspected for any smudging in non-image areas. The results are shown in Table 2. All prints were found to be excellent and free of smudging in non-image areas.

TABLE 2

| | Kind of planographic original plates | King of polymer employed | Smudging in non-image areas | | | |
|---|---|---|---|---|---|---|
| | | | Treatment (A) | Treatment (B) | Treatment (C) | Treatment (D) |
| Example 1 | A-1 | Polymer (1) | No problem | No problem | No problem | No problem |
| Example 2 | A-2 | Polymer (2) | No problem | No problem | No problem | No problem |
| Example 3 | A-3 | Polymer (3) | No problem | No problem | No problem | No problem |
| Example 4 | A-4 | Polymer (4) | No problem | No problem | No problem | No problem |
| Example 5 | A-5 | Polymer (5) | No problem | No problem | No problem | No problem |
| Example 6 | A-6 | Polymer (6) | No problem | No problem | No problem | No problem |
| Example 7 | A-7 | Polymer (7) | No problem | No problem | No problem | No problem |
| Example 8 | A-8 | Polymer (8) | No problem | No problem | No problem | No problem |

Examples 9 to 12

According to the formulation of a solution (B) given below, 4 solutions, namely, (B-1) to (B-4) were prepared using a relevant polymer selected from polymers (1), (3), (5) and (7) as shown in Table 3. After the preparation of the solutions, the solutions were coated, respectively, on the surface-treated aluminum plates as in Examples 1 to 8. The coated layers were dried at 80° C. for 3 minutes. In this way, planographic original plates (B-1) to (B-4) were obtained. After drying, the coated amount was 1.7 g/m².

| Solution (B) | in grams |
|---|---|
| Polymer for use in the present invention (polymer (1), (3), (5) or (7)) | 1.6 |
| Acid generating agent: | |
| 4-((4-(N,N-di(ethoxycarbonylmethyl)amino)phenyl)-2,6-bis-trichloromethyl-S-triazine | 0.1 |
| Megafac F-177 (a fluorine-containing surfactant manufactured by Dainippon Ink and Chemicals Inc.) | 0.06 |
| Methyl ethyl ketone | 20 |
| 1-methoxy-2-propanol | 15 |

The planographic original plates (B-1) to (B-4) were exposed image-wise by using a PS plate exposing device employing a metal halide lamp as a light source. After the exposure, the exposed original plates were thermally treated at 100° C. for 3 minutes and then printed using a Hidel SOR-M. The prints were inspected for any smudging in non-image areas. The prints were found to be excellent and free of smudging in non-image areas.

Meanwhile, in order to examine the storage stability of the plates, the planographic original plates (B-1) to (B-4) were stored at 60° C. for 7 days in a constant-temperature room. After the storage, the planographic original plates (B-1) to (B-4) were exposed image-wise again in the same way as above using a PS plate exposing device employing a metal halide lamp as a light source. After the exposure, the exposed original plates were thermally treated at 100° C. for 3 minutes without being processed in a developing processor, and were then printed using a Hidel SOR-M. The prints were inspected for any smudging in non-image areas. The prints were found to be excellent and free of smudging in non-image areas.

The results are shown in Table 3.

TABLE 3

| Kind of planographic original plate | Kind of polymer employed | Smudging in non-image areas | |
|---|---|---|---|
| | | Treatment (A) | Treatment (B) |
| Example 9 | B-1 | Polymer (1) | No problem | No problem |
| Example 10 | B-2 | Polymer (3) | No problem | No problem |
| Example 11 | B-3 | Polymer (5) | No problem | No problem |
| Example 12 | B-4 | Polymer (7) | No problem | No problem |

Examples 13 to 14 and Comparative Examples 1 to 3

Planographic original plates (C-1) to (C-5) were prepared by repeating the procedure of Example 1, except that the polymers as used therein were replaced respectively with the polymers shown in Table 4 (with the proviso that Example 13 used the same polymer as in Example 1).

Without being stored, the planographic original plates (C-1) to (C-5) were exposed to a semiconductor laser of 830 nm. After the exposure, the exposed original plates were thermally treated at 100° C. for 3 minutes and then rinsed with water. The state of image formation on the plate was then inspected.

Next, the planographic original plates (C-1) to (C-5) were stored in an environment maintained at 40° C. and 75% relative humidity for 10 days. After the storage, the same process was carried out as described above and the state of image formation on the plate was then inspected.

The results are shown in Table 4.

TABLE 4

| Kind of planographic original plate | Kind of polymer employed | Image forming capability | |
|---|---|---|---|
| | | Before storage | After storage* |
| Example 13 | C-1 | Polymer (1) | Good | Good |
| Example 14 | C-2 | Polymer (4) | Good | Good |
| Comparative Example 1 | C-3 | R-1 | Good | Incapable of forming image |
| Comparative Example 2 | C-4 | R-2 | Incapable of forming image | Incapable of forming image |
| Comparative Example 3 | C-5 | R-3 | Incapable of forming image | Incapable of forming image |

*Storing conditions: 45° C., 75% RH, 10 days

The structural formulas of the polymers R-1 to R-3 in Table 4 are given below.

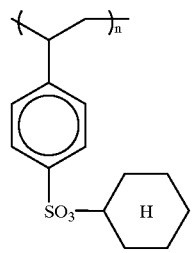

R-1

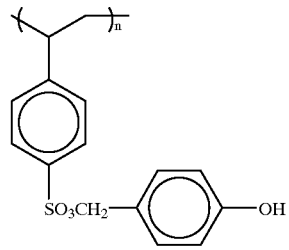

R-2 molecular weight 10,000   molecular weight 12,000

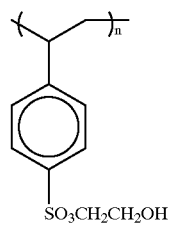

R-3 molecular weight 18,000

(Synthesis of a polymeric compound having as a side chain the structural unit represented by the general formula (2))
Synthesis of a monomer (1) indicated by the formula 14

84.9 g of 2-methyl-2-hydroxymethyl-t-butyl aceto acetate, 300 mL of acetonitrile and 130 g of pyridine were placed in a 1000 mL three-neck flask, and a solution was produced. Then, 71 g of styrenesulfonyl chloride was added dropwise to the solution while the solution was being stirred and cooled by ice. After the completion of the addition, the reaction solution was stirred for 5 hours at the same temperature. Then, the reaction solution was poured into 1,000 g of ice water containing 135 mL of concentrated hydrochloric acid. The mixture was extracted with ethyl acetate. After being washed with water, the solution in ethyl acetate was dried by magnesium sulfate and the solvent was removed from the solution at a reduced pressure. The residue was purified by means of silica gel in a column. In this way, a monomer (i.e., a monomer (1) indicated by the formula 14) having the structural unit represented by the general formula (2) was obtained. Results of elemental analysis of the monomer (1) obtained were as follows: C: 89.43% and H: 6.91% (theoretical C: 89.66% and H: 6.85%).

Peak data of IR spectrum and NMR (in CDCl$_3$) data of the monomer (1) indicated by the formula 14 are given below.
IR spectrum: 1710 cm$^{-1}$, 1370 cm$^{-1}$, 1190 cm$^{-1}$, 1165 cm$^{-1}$
NMR (in CDCl$_3$) data:

7.84 ppm, 2H,m 7.56 ppm, 2H,m
6.76 ppm, 1H,dd J=11.0, 17.6 Hz
5.91 ppm, 1H,d, J=17.6 Hz
5.47 ppm, 1H,d, J=11.0 Hz
4.35 ppm, 1H,d, J=9.6 Hz
4.25 ppm, 1H,d, J=9.6 Hz
2.14 ppm, 3H,S, 1.41 ppm, 9H,S,
1.39 ppm, 3H,S Synthesis of a Polymer (1)

20 g of the monomer (1) indicated by the formula 14 and 40 g of methyl ethyl ketone were placed in a 200 mL threeneck flask, and a solution was produced. Then, the temperature of the solution was raised to 65° C. At this temperature, 0.25 g of azobisdimethylvaleronitrile was added to the solution under a nitrogen stream. The reaction mixture was stirred for 5 hours while being kept at 65° C. After this reaction time, the solvent was removed at a reduced pressure to obtain a solid reaction product. As a result of GPC analysis, this reaction product was found to be a polymer having a weight average molecular weight of 10,800 and to be a polymer (polymer (1)) having as a side chain the structural unit represented by the general formula (2) based on the starting materials.

Synthesis of Polymers (2) to (8)

Polymers (2) to (8) were prepared by repeating the procedure for the synthesis of the polymer (1), except that the monomer (1) as used therein was replaced with the following monomers (indicated by the formulas 14 to 15), respectively, whose structures were given previously. Weight average molecular weights of the polymers (2) to (8) by GPC are also shown below.

| Synthesis | Starting Materials | | Molecular Weight |
|---|---|---|---|
| Polymer (2) | Monomer (2) | 20 g | 12,000 |
| Polymer (3) | Monomer (3) | 20 g | 14,000 |
| Polymer (10) | Monomer (10) | 20 g | 21,000 |
| Polymer (5) | Monomer (1): methacryloyl-propyltri-methoxysilane: | 17.1 g + 2.9 g | 35,000 |
| Polymer (6) | Monomer (6) | 20 g | 10,000 |
| Polymer (7) | Monomer (7) | 20 g | 28,000 |
| Polymer (8) | Monomer (8) | 20 g | 15,000 |

Examples 15 to 22

A 0.30 mm thick aluminum plate (type of material: 1050) was cleaned with trichloroethylene and grained with a nylon brush using an aqueous suspension of 400 mesh pumice powder. After being well rinsed with water, the aluminum plate was etched by a process comprising the steps of immersing the aluminum plate in a 25% aqueous solution of sodium hydroxide at 45° C. for 9 seconds, rinsing the aluminum plate with water, immersing the aluminum plate in a 2% aqueous solution of $HNO_3$ for 20 seconds and rinsing the aluminum plate with water. In the process, the etched amount of the grained aluminum plate was about 3 $g/m^2$. After the process, the aluminum plate was subjected to an anodizing process comprising immersing the aluminum plate in a 7% $H_2SO_4$ electrolyte solution through which a d. c. current with a current density of 15 A/$dm^2$ was passed. This process produced an anodized film of 2.4 $g/m^2$. Then, the surface-treated aluminum plate was rinsed with water and thereafter dried.

According to the formulation of a solution (A) given below, 8 solutions, namely, (A-1) to (A-8) were prepared using a relevant polymer selected from the above-mentioned polymers (1) to (8). After the preparation of the solutions, the solutions were coated, respectively, on the surface-treated aluminum plates. The coated layers were dried at 80° C. for 3 minutes. In this way, planographic original plates (A-1) to (A-8) were obtained. After drying, the coated amount was 1.2 $g/m^2$.

| Solution (A) | in grams |
|---|---|
| Polymeric compound having as a side chain the structural unit represented by the general formula (2) (polymer (1) to (8)) | 1.6 |
| Infrared ray absorber IR-125 (manufactured by Wako Junyaku, Ltd.) | 0.15 |
| Acid generating agent: diphenyliodonium anthraquinonesulfonate | 0.15 |
| A dye prepared by using 1-naphthalenesulfonic acid as the counter ion of Victoria Pure Blue BOH | 0.05 |
| Megafac F-177 (a fluorine-containing surfactant manufactured by Dainippon Ink and Chemicals Inc.) | 0.06 |
| Methyl ethyl ketone | 20 |
| γ-butylolactone | 10 |
| 1-methoxy-2-propanol | 8 |
| Water | 2 |

The planographic original plates (A-1) to (A-8) were exposed image-wise to a YAG laser emitting infrared rays having a wavelength of 1064 nm. After the exposure, the planographic original plates (A-1) to (A-8) were each divided into 4 areas. Then, each printing plate was printed according to the following conditions.

(A) Water-developing and printing using a Hidel SOR-M
(B) Thermal treating at 100° C. for 3 minutes followed by water-developing and printing using a Hidel SOR-M
(C) The plates were printed without any further treatment using a Hidel SOR-M
(D) Thermal treating at 100° C. for 3 minutes and printing using a Hidel SOR-M. The prints were inspected for any smudging in non-image areas. The results are shown in Table 5. All prints by the planographic original plates of the present invention were found to be excellent and free of smudging in non-image areas, irrespective of the plate conditions, i.e., implementation of water-developing, omission of the developing process, and implementation or omission of thermal treatment.

TABLE 5

| Examples | Polymeric compounds | Treatment (A) Smudging in non-image areas | Treatment (B) Smudging in non-image areas | Treatment (C) Smudging in non-image areas | Treatment (D) Smudging in non-image areas |
|---|---|---|---|---|---|
| A-1 | Polymer (1) | No problem | No problem | No problem | No problem |
| A-2 | Polymer (2) | No problem | No problem | No problem | No problem |
| A-3 | Polymer (3) | No problem | No problem | No problem | No problem |

TABLE 5-continued

| Examples | Polymeric compounds | Treatment (A) Smudging in non-image areas | Treatment (B) Smudging in non-image areas | Treatment (C) Smudging in non-image areas | Treatment (D) Smudging in non-image areas |
|---|---|---|---|---|---|
| A-4 | Polymer (4) | No problem | No problem | No problem | No problem |
| A-5 | Polymer (5) | No problem | No problem | No problem | No problem |
| A-6 | Polymer (6) | No problem | No problem | No problem | No problem |
| A-7 | Polymer (7) | No problem | No problem | No problem | No problem |
| A-8 | Polymer (8) | No problem | No problem | No problem | No problem |

Examples 23 to 26

According to the formulation of a solution (B) given below, 4 solutions, namely, (B-1) to (B-4) were prepared using a relevant polymer selected from polymers (1), (3), (5) and (7). After the preparation of the solutions, the solutions were coated, respectively, on the surface-treated aluminum plates as in Examples 15 to 22. The coated layers were dried at 80° C. for 3 minutes. In this way, planographic original plates (B-1) to (B-4) were obtained. After drying, the coated amount was 1.7 g/m$^2$.

| Solution (B) | in grams |
|---|---|
| Polymeric compound having as a side chain the structural unit represented by the general formula (2) (polymer (1), (3), (5) or (7)) | 1.6 |
| Acid generating agent: | |
| 4-((4-(N,N-di(ethoxycarbonylmethyl)amino)phenyl)-2,6-bis-trichloromethyl-S-triazine | 0.1 |
| Megafac F-177 (a fluorine-containing surfactant manufactured by Dainippon Ink and Chemicals Inc.) | 0.06 |
| Methyl ethyl ketone | 20 |
| 1-methoxy-2-propanol | 15 |

The planographic original plates (B-1) to (B-4) were exposed image-wise using a PS plate exposing device employing a metal halide lamp as a light source. After the exposure, the exposed original plates were thermally treated at 100° C. for 3 minutes and then printed using a Hidel SOR-M. The prints were inspected for any smudging in non-image areas.

TABLE 6

| Examples | Polymeric compounds | Immediately after the preparation of original plates Smudging in non-image areas | After 7 days storage at 60° C. Smudging in non-image areas |
|---|---|---|---|
| B-1 | Polymer (1) | No problem | No problem |
| B-2 | Polymer (3) | No problem | No problem |
| B-3 | Polymer (5) | No problem | No problem |
| B-4 | Polymer (7) | No problem | No problem |

As Table 6 shows, the prints obtained were found to be excellent and free of smudging in non-image areas.

Meanwhile, in order to examine the storage stability of the plates, the planographic original plates (B-1) to (B-4) were stored at 60° C. for 7 days in a constant-temperature room. After the storage, the planographic original plates (B-1) to (B-4) were exposed image-wise again in the same way as above using a PS plate exposing device employing a metal halide lamp as a light source. After the exposure, the exposed original plates were thermally treated at 100° C. for 3 minutes without being processed in a developing processor, and printed using a Hidel SOR-M. The results are shown in Table 6. As is apparent from these results, the characteristics of the planographic original plates of the present invention did not deteriorate even after the storage at a high temperature, and the prints were found to be excellent and free of smudging in non-image areas.

Example 27

The following solution (C) was prepared, and a planographic printing plate (C-1) was prepared as in Examples 15 to 22.

| Solution (C) | in grams |
|---|---|
| Polymeric compound having as a side chain the structural unit represented by the general formula (2) (polymer (1)) | 1.6 |
| Infrared ray absorber IR-125 (manufactured by Wako Junyaku, Ltd.) | 0.15 |
| Methyl ethyl ketone | 20 |

The planographic printing plate (C-1) was exposed to a YAG laser emitting infrared rays having a wavelength of 1064 nm at a scanning speed which was one-fourth of the scanning speed employed in Example 1. After the exposure, the planographic printing plate (C-1) underwent no developing processing and was printed by a Hidel SOR-M. The prints obtained were found to be excellent and free of smudging in non-image areas.

(Synthesis of a polymeric compound having as a side chain the structural unit represented by the general formula (3))

Synthesis of a monomer (1) indicated by the formula 22

42.2 g of 2,3-di(4-vinylbenzenesulfonyl)butane, 11.2 g of t-butoxypotassium, and 200 mL of t-butyl alcohol were-placed in a 1000 mL three-neck flask, and a solution was produced. The reaction solution was heated at reflux while being stirred for 15 minutes. After that, the reaction solution was cooled to room temperature. Then, the reaction solution was poured into 1,000 g of water. The mixture was extracted with ethyl acetate. After being washed with water, the solution in ethyl acetate was dried by magnesium sulfate and the solvent was removed from the solution at a reduced pressure. The residue was purified by means of silica gel in a column using a 5/1 by volume mixture of hexane/ethyl acetate for elution. Results of elemental analysis of the monomer (1) obtained were as follows: C: 60.53% and H: 5.81% (theoretical C: 60.48% and H: 5.92%).

Synthesis of a Polymer (1)

25 g of the monomer (1) and 50 g of methyl ethyl ketone were placed in a 200 mL three-neck flask, and a solution was produced. Then, the temperature of the solution was raised to 65° C. At this temperature, 0.25 g of azobisdimethylvaleronitrile was added to the solution under a nitrogen stream.

The reaction mixture was stirred for 5 hours while being kept at 65° C. After this reaction time, the solvent was removed at a reduced pressure to obtain a solid reaction product. As a result of GPC analysis, this reaction product was found to be a polymer having a weight average molecular weight of 13,400 (polymer (1)).

Synthesis of a Monomer (2) Indicated by the Formula 22

45.0 g of 2,2-dimethyl-3,4-di(4-vinylbenzenesulfonyl) butane, 11.2 g of t-butoxypotassium, and 200 mL of t-butyl alcohol were placed in a 1000 mL three-neck flask, and a solution was produced. The reaction solution was heated at reflux while being stirred. After that, the reaction solution was cooled to room temperature. Then, the reaction solution was poured into 1,000 g of water. The mixture was extracted with ethyl acetate. After being washed with water, the solution in ethyl acetate was dried by magnesium sulfate and the solvent was removed from the solution at a reduced pressure. The residue was purified by means of silica gel in a column using a 4/1 by volume mixture of hexane/ethyl acetate for elution. Results of elemental analysis of the monomer (2) obtained were as follows: C: 60.93% and H: 6.85% (theoretical C: 63.13% and H: 6.81%).

Synthesis of a Polymer (2)

20 g of the monomer (2) and 40 g of methyl ethyl ketone were placed in a 200 mL three-neck flask, and a solution was produced. Then, the temperature of the solution was raised to 65° C. At this temperature, 0.25 g of azobisdimethylvaleronitrile was added to the solution under a nitrogen stream. The reaction mixture was stirred for 5 hours while being kept at 65° C. After this reaction time, the solvent was removed at a reduced pressure to obtain a solid reaction product. As a result of GPC analysis, this reaction product was found to be a polymer having a weight average molecular weight of 10,300 (polymer (2)).

Examples 28 to 35

A 0.30 mm thick aluminum plate (type of material: 1050) was cleaned with trichloroethylene and grained with a nylon brush using an aqueous suspension of 400 mesh pumice powder. After being well rinsed with water, the aluminum plate was etched by a process comprising the steps of immersing the aluminum plate in a 25% aqueous solution of sodium hydroxide at 45° C. for 9 seconds, rinsing the aluminum plate with water, immersing the aluminum plate in a 2% aqueous solution of $HNO_3$ for 20 seconds, and rinsing the aluminum plate with water. In the process, the etched amount of the grained aluminum plate was about 3 g/m$^2$. After the process, the aluminum plate was subjected to an anodizing process comprising immersing the aluminum plate in a 7% $H_2SO_4$ electrolyte solution through which a d. c. current with a current density of 15 A /dm$^2$ was passed. This process produced an anodized film of 2.4 g/m$^2$. Then, the surface-treated aluminum plate was rinsed with water and thereafter dried.

According to the formulation of a solution (A) given below, 8 solutions, namely, (A-1) to (A-8) were prepared using a relevant polymeric compound having as a side chain the structural unit represented by the general formula (3).

The polymeric compounds were the polymers (1) to (8) indicated by the formula 25. After the preparation of the solutions, the solutions were coated, respectively, on the surface-treated aluminum plates. The coated layers were dried at 80° C. for 3 minutes. In this way, planographic original plates (A-1) to (A-8) were obtained. After drying, the coated amount was 1.2 g/m$^2$.

| Solution (A) | in grams |
|---|---|
| Polymeric compound having as a side chain the structural unit represented by the general formula (3) (polymer (1) to (8)) | 4.0 |
| Infrared ray absorber IR-125 (manufactured by Wako Junyaku, Ltd.) | 0.15 |
| Acid generating agent: | |
| diphenyliodonium diethoxyanthracenesulfonate | 0.15 |
| Methyl ethyl ketone | 30 |
| 1-methoxy-2-propanol | 8 |

The planographic original plates (A-1) to (A-8) were exposed image-wise to a YAG laser emitting infrared rays having a wavelength of 1064 nm. After the exposure, the planographic original plates (A-1) to (A-8) were each divided into 4 sections. Then, the printing plates were printed according to the following conditions.

(A) Water-developing and printing using a Hidel SOR-M
(B) Thermal treating at 100° C. for 3 minutes followed by water-developing and printing using a Hidel SOR-M
(C) The plates were printed with no further processing using a Hidel SOR-M
(D) Thermal treating at 100° C. for 3 minutes and thereafter printing using a Hidel SOR-M. The prints were inspected for any smudging in non-image areas. The results are shown in Table 7. The prints by the planographic original plates of the present invention were found to be excellent and free of smudging in non-image areas.

TABLE 7

| Original plates | Polymeric compounds | Treatment (A) Smudging in non-image areas | Treatment (B) Smudging in non-image areas | Treatment (C) Smudging in non-image areas | Treatment (D) Smudging in non-image areas |
|---|---|---|---|---|---|
| A-1 | (1) | No problem | No problem | No problem | No problem |
| A-2 | (2) | No problem | No problem | No problem | No problem |
| A-3 | (3) | No problem | No problem | No problem | No problem |
| A-4 | (4) | No problem | No problem | No problem | No problem |
| A-5 | (5) | No problem | No problem | N0 problem | No problem |
| A-6 | (6) | No problem | No problem | No problem | No problem |
| A-7 | (7) | No problem | No problem | No problem | No problem |
| A-8 | (8) | No problem | No problem | No problem | No problem |

It can be seen from the results of Table 7 that the printings by the planographic original plates of the present invention were found to be are excellent and free of smudging in non-image areas, irrespective of the plate conditions, i.e., the implementation or omission of thermal treatment and also of the developing process.

Examples 36 to 37

According to the formulation of a solution (B) given below, 2 solutions, namely, (B-1) and (B-2) were prepared using a relevant polymeric compound having as a side chain the structural unit represented by the general formula (3). After the preparation of the solutions, the solutions were coated, respectively, on the surface-treated aluminum plates as in Examples 28 to 35. The coated layers were dried at 80° C. for 3 minutes. In this way, planographic original plates (B-1) to (B-2) were obtained. After drying, the coated amount was 1.3 g/m².

| Solution (B) | in grams |
|---|---|
| Polymeric compound having as a side chain the structural unit represented by the general formula (3) (polymer (1) or (2)) | 1.6 |
| Acid generating agent: | |
| 4-((4-(N,N-di(ethoxycarbonylmethyl)amino)phenyl)-2,6-bis-trichloromethyl-S-triazine | 0.1 |
| Megafac F-177 (a fluorine-containing surfactant manufactured by Dainippon Ink and Chemicals Inc.) | 0.06 |
| Methyl ethyl ketone | 20 |
| 1-methoxy-2-propanol | 15 |

The planographic original plates (B-1) to (B-2) were exposed image-wise using a PS plate exposing device employing a metal halide lamp as a light source. After the exposure, the exposed original plates were thermally treated at 100° C. for 3 minutes and then printed using a Hidel SOR-M. The prints were inspected for any smudging in non-image areas. The prints obtained by the planographic original plates of the present invention were found to be excellent and free of smudging in non-image areas.

Next, the planographic original plates (A-1) to (A-8) of Examples 28 to 35 and (B-1) to (B-2) of Examples 36 to 37 were stored at 60° C. for 14 days in a constant-temperature room. After the storage, the planographic original plates (A-1) to (A-8) were exposed as in Examples 28 to 35, while (B-1) to (B-2) were exposed as in Examples 36 to 37. After the exposure, the exposed original plates were thermally treated at 100° C. for 3 minutes without being processed in a developing processor, and printed using a Hidel SOR-M. The prints were inspected for the state of image formation and any smudging in non-image areas. The results are shown in Table 8.

TABLE 8

| Original plates | Polymeric compounds | After storage of 14 days at 60° C. Smudging in non-image areas |
|---|---|---|
| A-1 | (1) | No problem |
| A-2 | (2) | No problem |
| A-3 | (3) | No problem |
| A-4 | (4) | No problem |
| A-5 | (5) | No problem |
| A-6 | (6) | No problem |
| A-7 | (7) | No problem |
| A-8 | (8) | No problem |
| B-1 | (1) | No problem |
| B-2 | (2) | No problem |

As is apparent from Table 8, even after storage at a high temperature, all of the planographic original plates (A-1) to (A-8) and (B-1) to (B-2) provided sharp positive images, and the prints were found to be excellent and free of smudging in non-image areas.

As stated above, the present invention provides a planographic original plate which can be engraved directly by visible rays or laser beams such as infrared rays. The planographic original plate of the present invention can be water-developed. Moreover, neither wet-process developing after image-wise exposure nor special treatments such as rubbing are required. Therefore, the image-wise exposed printing plate can be mounted directly on a printing machine so as to be used for printing.

What is claimed is:

1. A planographic original plate comprising a substrate and a photosensitive layer which is supported by the substrate and contains a polymeric compound having as a side chain at least one structural unit selected from the group consisting of a structural unit represented by the general formula (1), a structural unit represented by the general formula (2) and a structural unit represented by the general formula (3);

General Formula (1)

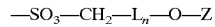

wherein, in the general formula (1), L represents a linking group composed of anon-metallic atom, —O—Z represents a group which is decomposed by an acid to become —OH, and n is 0 or 1;

General Formula (2)

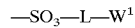

wherein, in the general formula (2), $W^1$ represents a group which is decomposed by an acid and is selected from an ester group, a ketal group, a thioketal group, an acetal group and a tertiary alcohol group, and L represents a polyvalent linking group comprising a non-metallic atom, which is necessary for linking the structural unit which is represented by the general formula (2) to a polymer skeleton, and whose decomposition accompanies the decomposition of $W^1$, which is decomposed by an acid, to generate sulfonic acid;

General Formula (3)

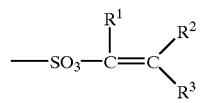

wherein, in the general formula (3), $R^1$ to $R^3$ may be the same or different, and each represents a group selected from a hydrogen atom, an alkyl group, an aryl group, a substituted amino group, an alkylthio group, an arylthio group, an alkoxy group, an aryloxy group, a carboxyl group, an alkoxycarbonyl group, an aryloxycarbonyl group, an acyl group, a cyano group, a halogen atom, and an amido group, whereby any two of $R^1$ to $R^3$ and a carbon atom linked thereto may form a ring together with a non-metallic atom.

2. A planographic original plate according to claim 1, wherein the content of the structural unit represented by any one of the general formulas (1) to (3) in the polymeric compound is 5% by weight or more.

3. A planographic original plate according to claim 1, wherein the photosensitive layer becomes hydrophilic in the presence of an acid.

4. A planographic original plate according to claim 1, wherein the photosensitive layer contains an acid generating agent.

5. A planographic original plate according to claim 4, wherein the acid generating agent is represented by any one of the following general formulas (PAG1), (PAG2), (PAG3), (PAG4), (PAG5) and (PAG6)

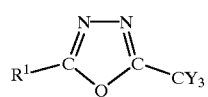 (PAG1)

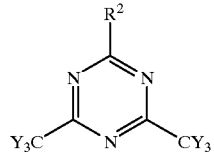 (PAG2)

 (PAG3)

 (PAG4)

-continued

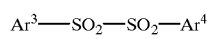 (PAG5)

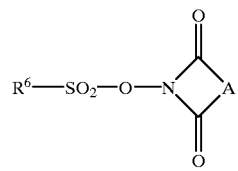 (PAG6)

6. A planographic original plate according to claim 1, wherein the photosensitive layer contains an infrared ray absorber.

7. A planographic original plate according to claim 1, wherein the substrate is a surface-treated aluminum plate.

* * * * *